United States Patent [19]
Ukita

[11] Patent Number: 6,088,276
[45] Date of Patent: Jul. 11, 2000

[54] SEMICONDUCTOR DEVICE PROVIDED WITH A CIRCUIT PERFORMING FAST DATA READING WITH A LOW POWER CONSUMPTION

[75] Inventor: Motomu Ukita, Hyogo, Japan

[73] Assignee: Mitsubishi Denki Kabushiki Kaisha, Tokyo, Japan

[21] Appl. No.: 09/166,090

[22] Filed: Oct. 5, 1998

[30] Foreign Application Priority Data

Apr. 20, 1998 [JP] Japan .................................. 10-109563

[51] Int. Cl.[7] .................................................. G11C 7/02
[52] U.S. Cl. ...................................... 365/207; 365/230.03
[58] Field of Search ............................. 365/230.03, 154, 365/156, 190, 196, 207

[56] References Cited

U.S. PATENT DOCUMENTS

| | | | |
|---|---|---|---|
| 5,274,598 | 12/1993 | Fujii et al. ................................ | 365/205 |
| 5,353,255 | 10/1994 | Komuro .................................. | 365/156 |
| 5,495,440 | 2/1996 | Asakura ............................... | 365/230.03 |
| 5,610,871 | 3/1997 | Hidaka ................................ | 365/230.03 |
| 5,850,367 | 12/1998 | Wada et al. ........................ | 365/230.03 |

FOREIGN PATENT DOCUMENTS 6-89586  3/1994  Japan .
8-69694  3/1996  Japan .

*Primary Examiner*—Amir Zarabian
*Assistant Examiner*—Van Thu Nguyen
*Attorney, Agent, or Firm*—McDermott, Will & Emery

[57] ABSTRACT

A semiconductor memory device includes load circuits of column sense amplifiers arranged correspondingly to Y-addresses (global bit line pairs), respectively. A plurality of memory blocks commonly use the load circuit. Each memory block includes input circuits of the column sense amplifiers for the bit line pairs, respectively. Each input circuit is activated in response to the corresponding block select signal. In response to the potential on the corresponding bit line pair, a potential difference occurs on the corresponding global bit line pair. The load circuit increases this potential difference.

17 Claims, 23 Drawing Sheets

SEMICONDUCTOR DEVICE PROVIDED WITH A CIRCUIT PERFORMING FAST DATA READING WITH A LOW POWER CONSUMPTION

BACKGROUND OF THE INVENTION

1. Field of the Invention

The present invention relates to a semiconductor memory device, and particularly a semiconductor memory device provided with a large capacity memory allowing a fast operation with a low power consumption.

2. Description of the Background Art

A conventional static semiconductor memory device 8000, which will be referred to as an "SRAM" hereinafter, will be briefly described below with reference to FIG. 23.

Conventional SRAM 8000 includes a memory cell array which is divided into a plurality of memory blocks. FIG. 23 shows one of memory blocks BKi and a structure related to the same.

In conventional SRAM 8000 shown in FIG. 23, memory block BKi includes a plurality of memory cells MC arranged in rows and columns, a plurality of bit line pairs BIT0 and /BIT0, BIT1 and /BIT1, . . . , BITn and /BITn, a plurality of word lines WL0, WL1, . . . and WLm, transfer gates 102.0, 102.1, . . . and 102.n, a data I/O line pair IO and /IO, and sense amplifiers 104 and 106.

The plurality of bit line pairs BIT0 and /BIT0, BIT1 and /BIT1, . . . , and BITn and /BITn (which will be generally referred to as bit line pairs BIT and /BIT, hereinafter) are arranged correspondingly to the columns, respectively. The plurality of word lines WL0, WL1, . . . and WLm (which will be generally referred to as word lines WL, hereinafter) are arranged correspondingly to the rows, respectively.

Transfer gates 102.0, 102.1, . . . and 102.n (which will be generally referred to as transfer gates 102, hereinafter) are arranged correspondingly to the columns, respectively.

Each transfer gate 102 includes NMOS transistors N90 and N91, PMOS transistors P90 and P91, and an inverter circuit 114, and outputs a signal, which is carried on corresponding bit line pair BIT and /BIT, onto data I/O line pair IO and /IO in response to corresponding one of Y-address signals Y0, Y1, . . . and Ym (which will be generally referred to as Y-address signals Y, hereinafter).

Sense amplifiers 104 and 106 amplify the signal on data I/O line pair IO and /IO.

Referring to FIG. 23, a read operation of conventional SRAM 8000 will be described below. In the following operation, data is to be read from memory cell MC located at a crossing, e.g., between bit line pair BIT0 and /BIT0 and word line WL0.

In this case, word line WL0 is set to the selected state (i.e., is raised to H-level). When word line WL0 is selected, data of memory cells MC connected to word lines WL0 is output onto corresponding bit line pairs BIT and /BIT, respectively.

Subsequently, Y-address signal Y0 is raised to H-level. Thereby, transfer gate 102.0 is activated, and the signal on corresponding bit line pair BIT0 and /BIT0 is output onto data I/O line pair IO and /IO.

Thereby, data of memory cell MC is amplified by sense amplifier 104 in the first stage and sense amplifier 106 in the second stage, and thereafter is externally output through a peripheral circuit (not shown).

FIGS. 24, 25 and 26 show structures of memory cells MC used in the conventional SRAMs. More specifically, FIG. 24 shows a structure of the memory cell of a full CMOS type, FIG. 25 shows a structure of the memory cell of a TFT load type, and FIG. 26 shows a structure of the memory cell of a high-resistance load type.

In FIG. 24, memory cell MC of the full CMOS type is formed of NMOS transistors N100, N101, N102 and N103 as well as PMOS transistors P100 and P101.

In FIG. 25, memory cell MC of the TFT load type is formed of NMOS transistors N105, N106, N107 and N108 as well as TFT elements T100 and T101.

In FIG. 26, memory cell MC of the high-resistance load type is formed of NMOS transistors N109, N110, N111 and N112 as well as resistance elements R100 and R101.

Memory cells which have recently been used in large-capacity SRAMs are miniaturized so that drive powers thereof have been reduced and, in other words, currents which can flow therethrough for output of signals onto bit lines have been reduced. This reduces speeds at which the signals are output from memory cells onto bit line pairs, and results in a tendency that a long time is required for externally outputting the read signal. This prevents a fast operation of the large-capacity SRAM, and further results in such a situation that a speed equal to that in the former generation cannot be achieved without difficult.

For compensating the drive power of the memory cell, a length of the bit line pair may be reduced for reducing a load driven by the memory cell.

According to this measure, the number of the memory cells per bit line pair (and therefore the size of the memory block) decrease. Therefore, it is necessary to increase the number of the memory blocks for ensuring a storage capacity. However, this increases the number of bit line pairs, and therefore increases the number of circuits such as load circuits and transfer gates connected to the bit line pairs, resulting in increase in chip size.

Particularly in the large-capacity SRAM, increase in chip size results in increase in cost. Therefore, mere reduction in length of the bit line pair cannot be employed.

In view of this, a column sense method may be employed as measures for reducing a load driven by the memory cell without increasing the length and number of the bit line pairs. A structure of an SRAM employing the conventional column sense method will be described below with reference to FIG. 27.

FIG. 27 shows one of memory blocks BKi and a structure related to the same in a conventional SRAM 9000 of the column sense type.

The same components as those of conventional SRAM 8000 in FIG. 23 bear the same reference numbers, and will not be described below.

Conventional SRAM 9000 of the column sense type shown in FIG. 27 employs a plurality of column sense amplifiers 108.0, 108.1, . . . and 108.n instead of sense amplifier 104 shown in FIG. 23.

Column sense amplifiers 108.0, 108.1, . . . , 108.n (which will be generally referred to as column sense amplifiers 108, hereinafter) are provided correspondingly to bit line pairs BIT and /BIT, respectively. Column sense amplifier 108 is activated in response to corresponding Y-address signal Y.

FIG. 28 is a circuit diagram showing an example of a specific structure of conventional column sense amplifier 108 shown in FIG. 27, and more specifically shows by way of example the structure of column sense amplifier 108.0. Structures of other column sense amplifiers 108 are the same as that of column sense amplifier 108.0 shown in FIG. 28.

Column sense amplifier 108.0 shown in FIG. 28 includes a load circuit 110 and an input circuit 112. Load circuit 110 includes PMOS transistors P120 and P121, and input circuit 112 includes NMOS transistors N120, N121 and N122.

PMOS transistor 120 is connected between a power supply potential and data I/O line IO, and has a gate electrode connected to data I/O line /IO. PMOS transistor P121 is connected between the power supply potential and data I/O line /IO, and has a gate electrode connected to data I/O line IO.

One of terminals of NMOS transistor N120 is connected to data I/O line IO, and the other is connected to NMOS transistor N122. One of terminals of NMOS transistor N121 is connected to data I/O line /IO, and the other is connected to NMOS transistor N122.

A gate electrode of NMOS transistor N120 is connected to corresponding bit line /BIT0. A gate electrode of NMOS transistor N102 is connected to corresponding bit line BIT0.

The other terminal of NMOS transistor N122 is connected to a ground potential. Further, NMOS transistor N122 receives corresponding Y-address signal Y0 on its gate electrode.

An operation of column sense amplifier 108.0 will be briefly described below. NMOS transistor N122 is turned on when Y-address signal Y0 attains H-level.

NMOS transistor N121 is turned on in response to a potential on bit line BIT0, and NMOS transistor N120 is turned on in response to a potential on bit line /BIT0.

When a minute potential difference occurs between bit lines BIT0 and /BIT0, a corresponding potential difference occurs between data I/O lines IO and /IO. Load circuit 110 amplifies this minute potential difference.

Owing to provision of column sense amplifiers 108 corresponding to the bit line pairs, respectively, the memory cell is not required to drive the resistance of the transfer gate and the capacity of the I/O line so that the potential on the bit line pair can be raised or lowered rapidly.

As described above, employment of conventional SRAM 9000 of the column sense type ensures a fast operation. However, provision of the column sense amplifiers for the respective bit line pairs causes unpreferable increase in chip area.

More specifically, conventional SRAM 8000 shown in FIG. 23 is provided with transfer gate 102, which is formed of four elements, for each column (bit line pair). However, conventional SRAM 9000 of the column sense type shown in FIG. 27 requires nine elements in total for column sense amplifier 108 formed of five elements and a transfer gate for writing, which has the same structure as transfer gate 102 and thus is formed of four elements, although not shown.

Measures for reducing a chip area are disclosed in "Sense Amplifier" (Japanese Patent Laying-Open No. 8-69694), which will be referred to as "Reference 1" hereinafter, and "Semiconductor Memory Device" (Japanese Patent Laying-Open No. 6-89586), which will be referred to as "Reference 2" hereinafter.

In the semiconductor memory devices disclosed in References 1 and 2, a sense amplifier load portion is commonly used in one memory block.

In the structure including memory blocks each formed of, e.g., 128 columns, the loads are reduced to 1/16 in number if 8-I/O structure is employed (i.e., each I/O is provided for 16 columns), and the loads are reduced to 1/8 in number if 16-I/O structure is employed (i.e., each I/O is provided for 8 columns).

In recent memory cell arrays, the number of bits has been increased for increase in speed and performance of CPUs and others, and it is expected that products employing 16-I/O structures and 32-I/O structures will be increasingly used. When the semiconductor memory devices disclosed in References 1 and 2 are used, it is necessary to change the number of loads in accordance with the I/O structure for maximizing the effect of reducing the area, and a single type cannot be used for various I/O structures.

SUMMARY OF THE INVENTION

An object of the invention is to provide a semiconductor memory device which can perform a fast operation with a suppressed chip area.

Another object of the invention is to provide a semiconductor memory device which can achieve a predetermined effect of reducing an area independently of an I/O structure.

A semiconductor memory device according to the invention includes a plurality of memory blocks each including a plurality of memory cells arranged correspondingly to a plurality of rows and a plurality of columns, respectively, a plurality of word lines arranged correspondingly to the plurality of rows, and a plurality of bit line pairs arranged correspondingly to the plurality of columns. The semiconductor memory device further includes a plurality of global bit line pairs each arranged commonly to the bit line pairs in the corresponding columns of the plurality of memory blocks. Each of the plurality of memory blocks further includes a plurality of input circuits arranged correspondingly to the plurality of bit line pairs, respectively. Each of the plurality of input circuits is responsive to a signal on the corresponding bit line pair to change the potential on the global bit line pair. The semiconductor memory device further includes a plurality of amplifier circuits arranged correspondingly to the plurality of global bit line pairs for changing the potentials on the corresponding global bit line pairs in response to signals on the corresponding bit line pairs, respectively. Each of the plurality of amplifier circuits is provided for amplifying the potential on the corresponding global bit line pair. The semiconductor memory device further includes a data I/O terminal and a data I/O line for transmitting a data signal between the plurality of global bit line pairs and the data I/O terminal.

A major advantage of the invention is as follows. Since the column sense type is employed and the load circuit of the column sense amplifier is commonly used by the plurality of memory blocks, a fast operation can be performed with a reduced power consumption, and a chip area can be reduced.

Particularly, an input circuit corresponding to the columns may be provided for each of the memory blocks, and a load circuit is provided commonly to the plurality of memory blocks. Each of the input circuits includes a control circuit operating in response to a corresponding block select signal.

In a read operation, therefore, the memory cell is required to drive only the bit line pair connected thereto. Consequently, fast reading of the data can be performed.

Particularly, an input circuit corresponding to the columns may be provided for each of the memory blocks, and a load circuit is provided commonly to the plurality of memory blocks. Each load circuit is activated in response to a corresponding Y-address. In a read operation, therefore, the memory cell is required to drive only the bit line pair connected thereto. Consequently, fast reading of the data can be performed. Also, it is not necessary to extend a line, which transmits the Y-address signal, to the memory block so that interconnections can be reduced in length, and reduction in yield can be suppressed.

Particularly, each input circuit may include a switch circuit provided for each bit line and being responsive to a corresponding block select signal. Thereby, a short circuit between the corresponding global bit lines can be prevented.

Since it is not necessary to extend a line, which transmits the Y-address signal, to the memory block, interconnections can be reduced in length, and reduction in yield can be suppressed.

Particularly, an input circuit portion of the column sense amplifier may be formed of the same transistors as those forming the memory cells. Thereby, it is possible to form the input circuit portion and the memory cell on a common substrate in the memory block. Consequently, the chip area can be reduced.

Particularly, the bit line pair may be formed of a metal interconnection of a first layer, and the global bit line pair, the Y-decode line and others may be formed of metal interconnections of a second layer crossing the bit line pair. The metal interconnections in the second layer may be set to the same level during standby. Thereby, it is possible to suppress the standby current even when a foreign substance of a high resistance is mixed into the structure.

The semiconductor memory device may further include a transfer gate for writing and reading. This can reduce both the numbers of elements required for writing and elements required for reading.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

A semiconductor memory device of an embodiment 1 of the invention will now be described below. In a semiconductor memory device of the embodiment 1 of the invention, a load circuit of a column sense amplifier is used commonly by a plurality of memory blocks for reducing a chip area.

Figure 1:
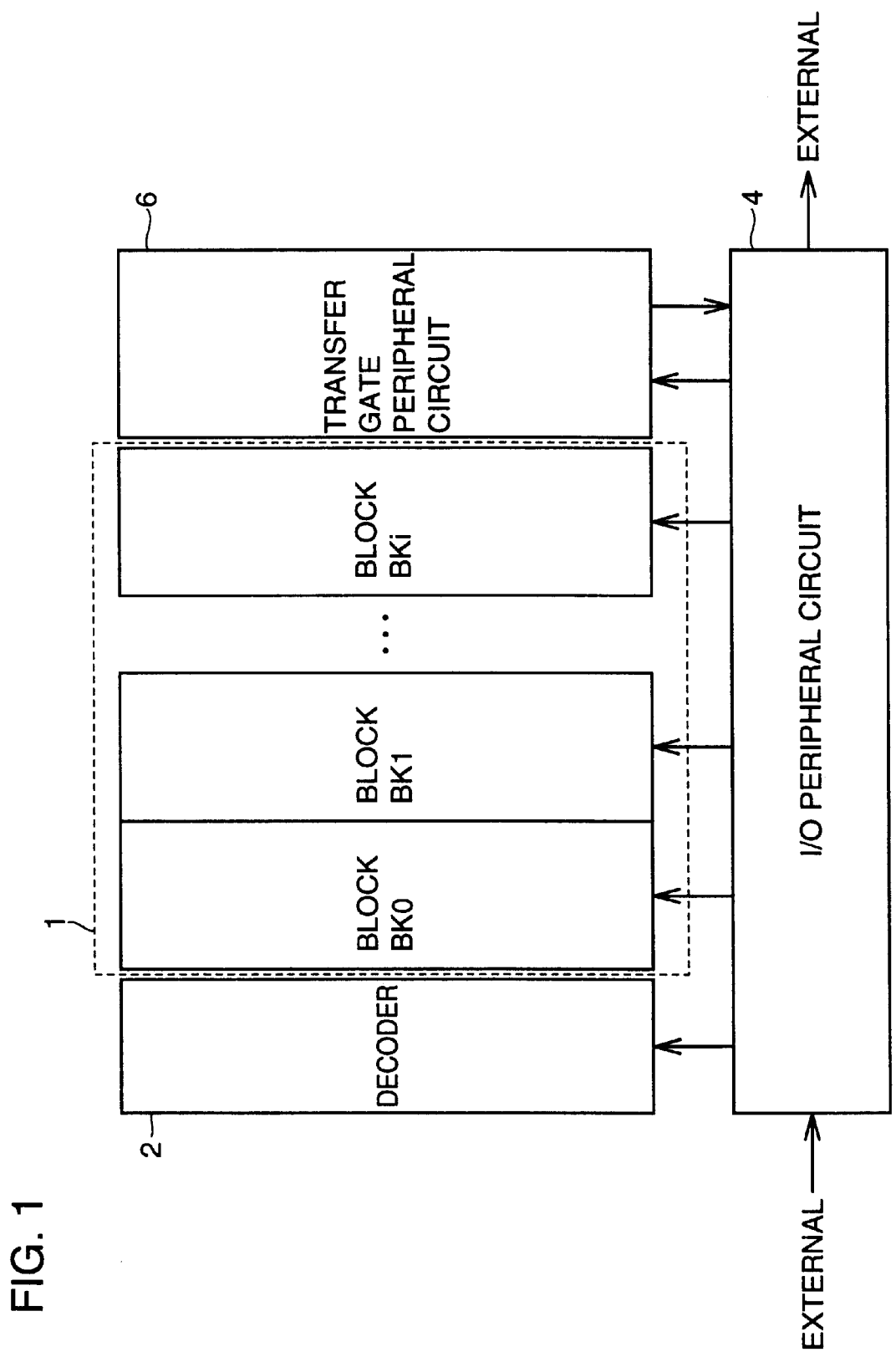
FIG. 1 shows a whole structure of a semiconductor memory device 1000 of an embodiment 1 of the invention.

A whole structure of the semiconductor memory device of the embodiment 1 of the invention will now be described below with reference to FIG. 1. As shown in FIG. 1, a semiconductor memory device 1000 includes a memory cell array 1, a decoder 2, an I/O peripheral circuit 4 and a transfer gate peripheral circuit 6.

Memory cell array 1 includes a plurality of memory cells arranged in rows and columns, a plurality of word lines each connected to the memory cells arranged in the row direction, and a plurality of bit line pairs each connected to the memory cells arranged in the column direction. This memory cell array 1 is divided into a plurality of memory blocks BK0, BK1, . . . and BKi. Memory blocks BK0, BK1, . . . and BKi (which will be generally referred to as memory blocks BK, hereinafter) commonly use a plurality of global bit lines.

Input/output peripheral circuit 4 is responsive to externally supplied signals, and operates to transmit corresponding input signals, internal control signals and others to decoder 2, memory cell array 1 or transfer gate peripheral circuit 6, and process data received from transfer gate peripheral circuit 6 for external output.

Decoder 2 is responsive to an address signal sent from I/O peripheral circuit 4, and sets the corresponding memory cell in corresponding memory block BK to the selected state.

Transfer gate peripheral circuit 6 amplifies data, which is read from memory cell array 1, and outputs the results to I/O peripheral circuit 4. It also operate to transmit data received from I/O peripheral circuit 4 to memory cell array 1.

As will be described later, transfer gate peripheral circuit 6 includes a plurality of load circuits corresponding to column sense amplifiers which are commonly used by memory blocks BK.

A relationship between transfer gate peripheral circuit 6 and memory cell array 1 shown in FIG. 1 will now be described below with reference to FIG. 2.

Commonly to memory blocks BK, there are arranged global bit line pairs GBL0 and /GBL0, GBL1 and /GBL1, ..., and GBLn and /GBLn (which will be generally referred to as global bit line pairs GBL and /GBL, hereinafter) corresponding to the columns, respectively.

Transfer gate peripheral circuit 6 includes a plurality of load circuits 20.0, 20.1, ... and 20.n corresponding to column sense amplifiers as well as transfer gates TG0, TG1, ... and TGn for reading and writing, data I/O line pair IO and /IO, and sense amplifiers SA1 and SA2.

Load circuits 20.0, (which will be generally referred to as load circuits 20, hereinafter) corresponding to column sense amplifiers as well as transfer gates TG0, TG1, ... (which will be generally referred to as transfer gates TG, hereinafter) for reading and writing are arranged correspondingly to global bit line pairs GBL and /GBL, respectively.

The data read from the memory cell changes the potentials on corresponding global bit line pair GBL and /GBL. The data on global bit line pair GBL and /GBL is amplified through corresponding load circuit 20.

Transfer gates TG receive Y-address signals Y0, Y1, ... and Yn from decoder 2 shown in FIG. 1, and invert them for issuing Y-address signals /Y0, /Y1, ... and /Yn (which will be generally referred to as Y-address signals /Y, hereinafter), respectively.

Each transfer gate TG is activated in response to corresponding Y-address signal Y, and thereby electrically couples corresponding global bit line pair GBL and /GBL to data I/O line pair IO and /IO.

Sense amplifier SA1 amplifies data on data I/O line pair IO and /IO, and issues a signal SO1 and an inverted signal /SO1 thereof. Sense amplifier SA2 amplifies the output of sense amplifier SA1 to issue a signal SO2. Signal SO2 is issued externally from the device through I/O peripheral circuit 4 shown in FIG. 1.

The structure of each memory block BL in memory cell array 1 shown in FIG. 1 will be described below with reference to FIG. 3.

Figure 3:
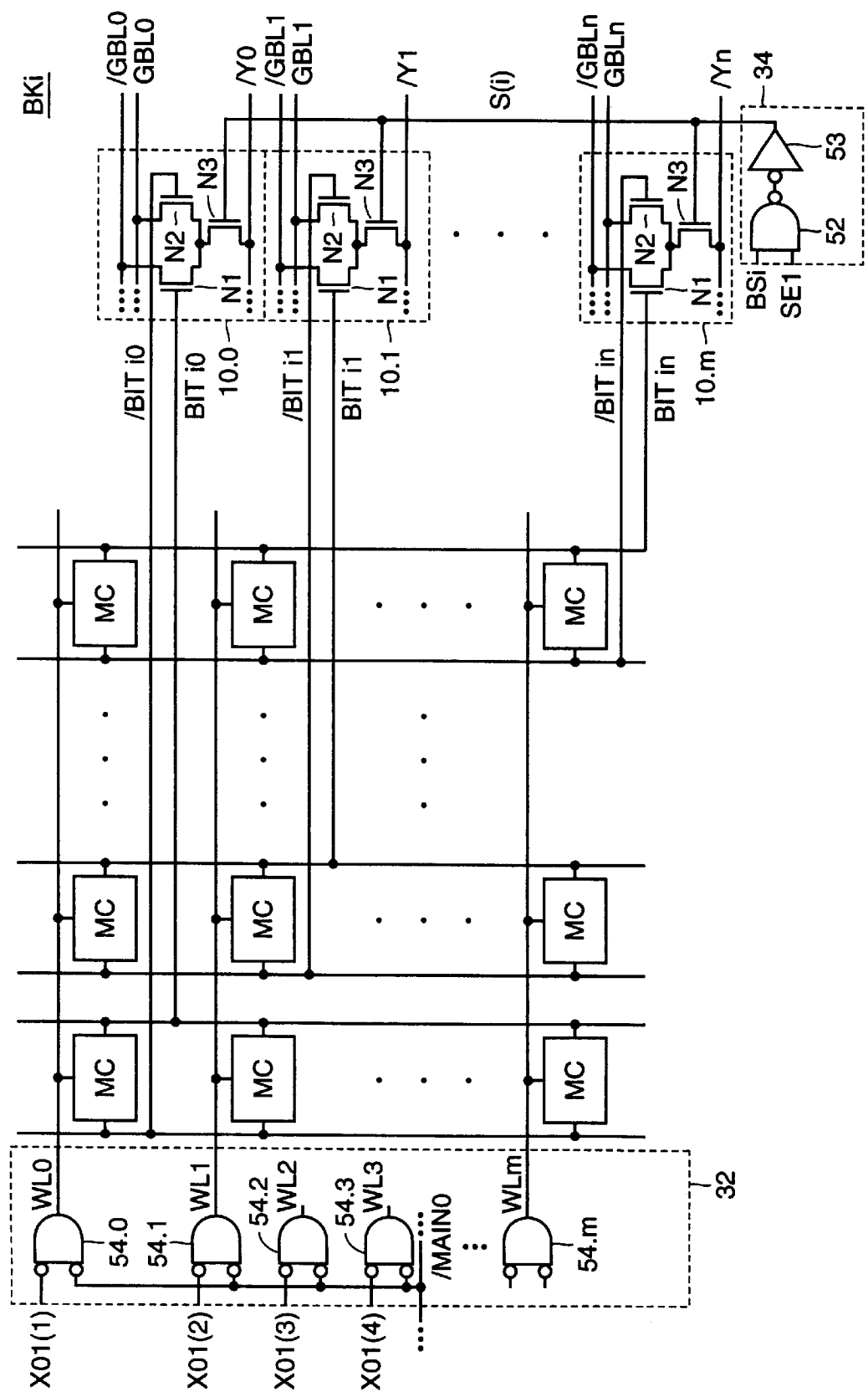
FIG. 3 shows an example of a specific structure of a memory block included in a memory cell array 1 shown in FIG. 1.

FIG. 3 representatively shows the structure of memory block BKi. Structures of memory blocks BK other than memory block BKi are the same as that of memory block BKi.

Memory block BKi shown in FIG. 3 includes the plurality of input circuits 10.0, 10.1, ... and 10.m corresponding to the column sense amplifiers, respectively, as well as the plurality of word lines WL0, WL1, ... and WLm, the plurality of bit line pairs BITi0 and /BITi0, BITi1 and /BITi1, ..., and BITin and /BITin, the plurality of memory cells MC, a word driver 32 and an activating circuit 34.

Memory cells MC are arranged correspondingly to the crossings between word lines WL and bit line pairs BIT and /BIT, respectively. Global bit line pairs GBL and /GBL are related to bit line pairs BIT and /BIT, respectively.

Description will be given on input circuits 10.0, (which will be generally referred to as input circuits 10, hereinafter) corresponding to the column sense amplifiers. Input circuits 10 are arranged correspondingly to the columns, i.e., bit line pairs BIT and /BIT, respectively. Each internal circuit 10 includes NMOS transistors N1, N2 and N3.

NMOS transistor N3 receives corresponding Y-address signal /Y on one of its conductive terminals. NMOS transistor N3 is turned on in response to a block-corresponding sense amplifier activating signal S(i) issued from activating circuit 34, which will be described later.

NMOS transistor N1 is connected between corresponding global bit line /GBL and the other conductive terminal of NMOS transistor N3. NMOS transistor N2 is connected between corresponding global bit line GBL and the other conductive terminal of NMOS transistor N3. A gate electrode of NMOS transistor N1 is connected to corresponding bit line BIT, and a gate electrode of NMOS transistor N2 is connected to corresponding bit line /BIT.

An operation of input circuit 10 will be briefly described below, for example, in connection with input circuit 10.0. NMOS transistor N3 is turned on when block-corresponding sense amplifier activating signal S(i) attains H-level (which designates memory block BKi as a target for reading). NMOS transistor N1 is turned on in response to the potential on corresponding bit line BITi0, and NMOS transistor N2 is turned on in response to the potential on corresponding bit line /BITi0.

When NMOS transistor N3 is on and a minute potential difference occurs between bit lines BITi0 and /BITi0, a corresponding difference in potential occurs between corresponding global bit lines GBL0 and /GBL0.

Activating circuit 34 will be described below. Activating circuit 34 includes an NAND circuit 52 and an inverter circuit 53. NAND circuit 52 receives on its inputs a corresponding block select signal BSi and a corresponding sense amplifier activating signal SE1. Inverter circuit 53 inverts the output of NAND circuit 52 and outputs the result. Inverter circuit 53 issues a block-corresponding sense amplifier activating signal S(i).

An operation of activating circuit 34 will be briefly described below. When memory block BKi is selected as a read target in accordance with an externally applied signal, block select signal BSi and sense amplifier activating signal SE1 attain H-level. Thereby, activating circuit 34 issues block-corresponding sense amplifier activating signal S(i) at H-level.

When the externally applied signal sets memory block BKi, which was selected as the read target, to the unselected state, or designates an operation other than the read operation, either block select signal BSi or sense amplifier activating signal SE1 attains L-level. Thereby, activating circuit 34 issues block-corresponding sense amplifier activating signal S(i) at L-level.

Word driver 32 will now be described below. Word driver 32 includes a plurality of gate circuits 54.0, 54.1, .... Gate circuits 54.0, ... are grouped into sets each including four, and each set including four receives corresponding one of main address signals /MAIN0, ... (which will be generally referred to as main address signals /MAIN, hereinafter) issued from decoder 2 shown in FIG. 1. Main address signals /MAIN determine higher addresses in the row direction. X-address signals X01(1), X01(2), ... issued from decoder 2 shown in FIG. 1 determine lower addresses in the row direction.

More specifically, gate circuits 54.0, 54.1, 54.2 and 54.3 receive main address signal /MAIN0. Further, gate circuit 54.0 receives X-address signal X01(1) on its input, and gate circuit 54.1 receives X-address signal X01(2) on its input. Gate circuit 54.2 receives X-address signal X01(3) on its input, and gate circuit 54.3 receives inverted X-address signal X01(4) on its input.

An operation of word driver 32 will be described below. For example, four word lines WL0, WL1, WL2 and WL4 are selected from the plurality of word lines WL in accordance with main address signal /MAIN0. Specific word line WL (e.g., word line WL0 if X-address signal X01(1) is at a specific level) is selected in accordance with the X-address signal.

A relationship between load circuits 20 and input circuits 10 shown in FIGS. 2 and 3 will be further described below with reference to FIGS. 4, 5 and 6.

Figure 2:
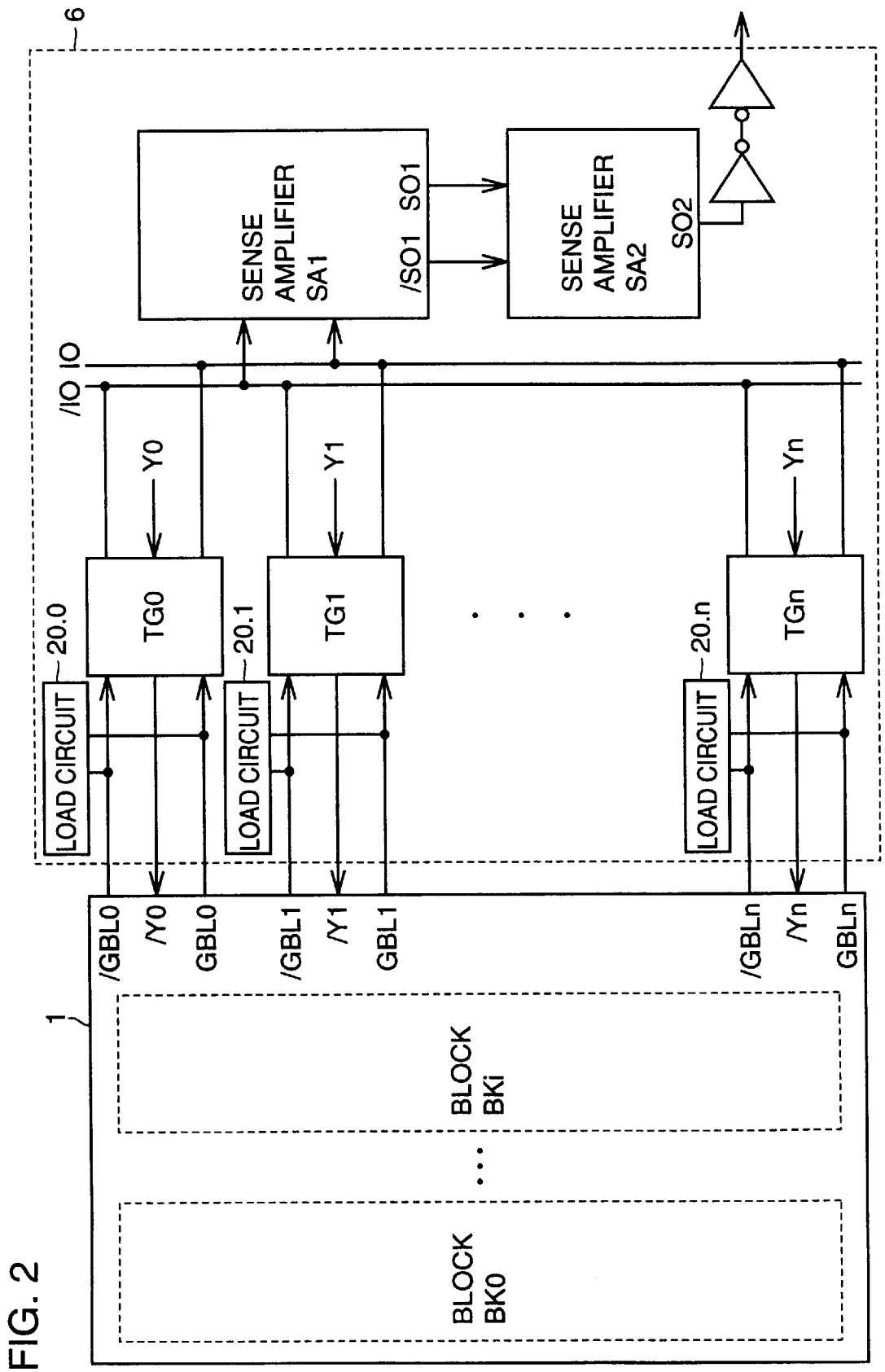
FIG. 2 shows an example of a specific structure of a transfer gate peripheral circuit 6 shown in FIG. 1.
Figure 4:
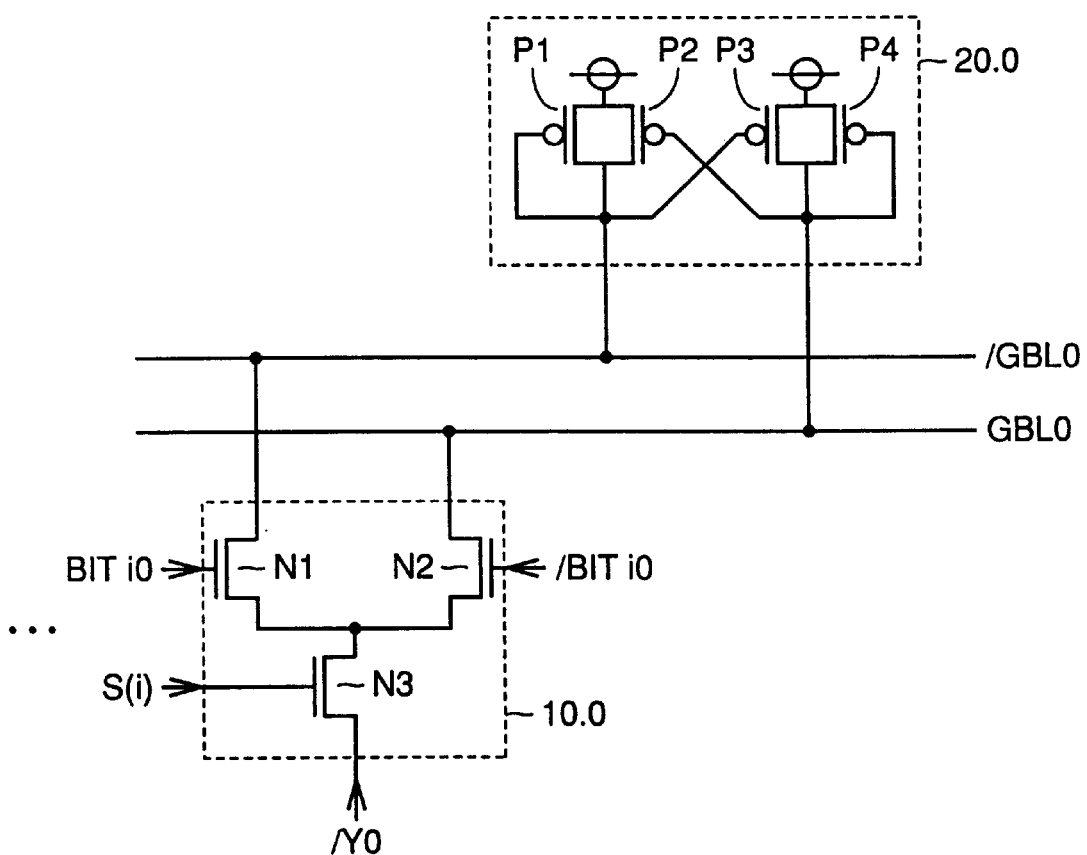
FIG. 4 shows an example of a specific structure of a load circuit 20 shown in FIG. 2.

FIG. 4 shows an example of a specific structure of load circuit 20 shown in FIG. 2, and particularly shows, as a representative example, load circuit 20.0 corresponding to global bit line pair GBL0 and /GBL0. For reference, a relationship with input circuit 10.0 of memory block BKi shown in FIG. 3 will also be described. Other load circuits 20 have the same structures as load circuit 20.0 shown in FIG. 4.

As shown in FIG. 4, load circuit 20.0 includes PMOS transistors P1, P2, P3 and P4. PMOS transistors P1 and P2 are connected between the power supply potential and corresponding global bit line /GBL0. PMOS transistors P3 and P4 are connected between the power supply potential and corresponding global bit line GBL0. Gate electrodes of PMOS transistors P1 and P3 are connected to corresponding global bit line /GBL0. Gate electrodes of PMOS transistors P2 and P4 are connected to corresponding global bit line GBL0. In each memory block BK, input circuit 10.0 is arranged for corresponding global bit line pair GBL0 and /GBL0.

An operation of load circuit 20.0 will be described below. As already described, input circuit 10.0 produces a minute potential difference between global bit lines GBL0 and /GBL0 correspondingly to the potential difference on the corresponding bit line pair. Load circuit 20.0 expands this minute potential difference.

Figure 5:
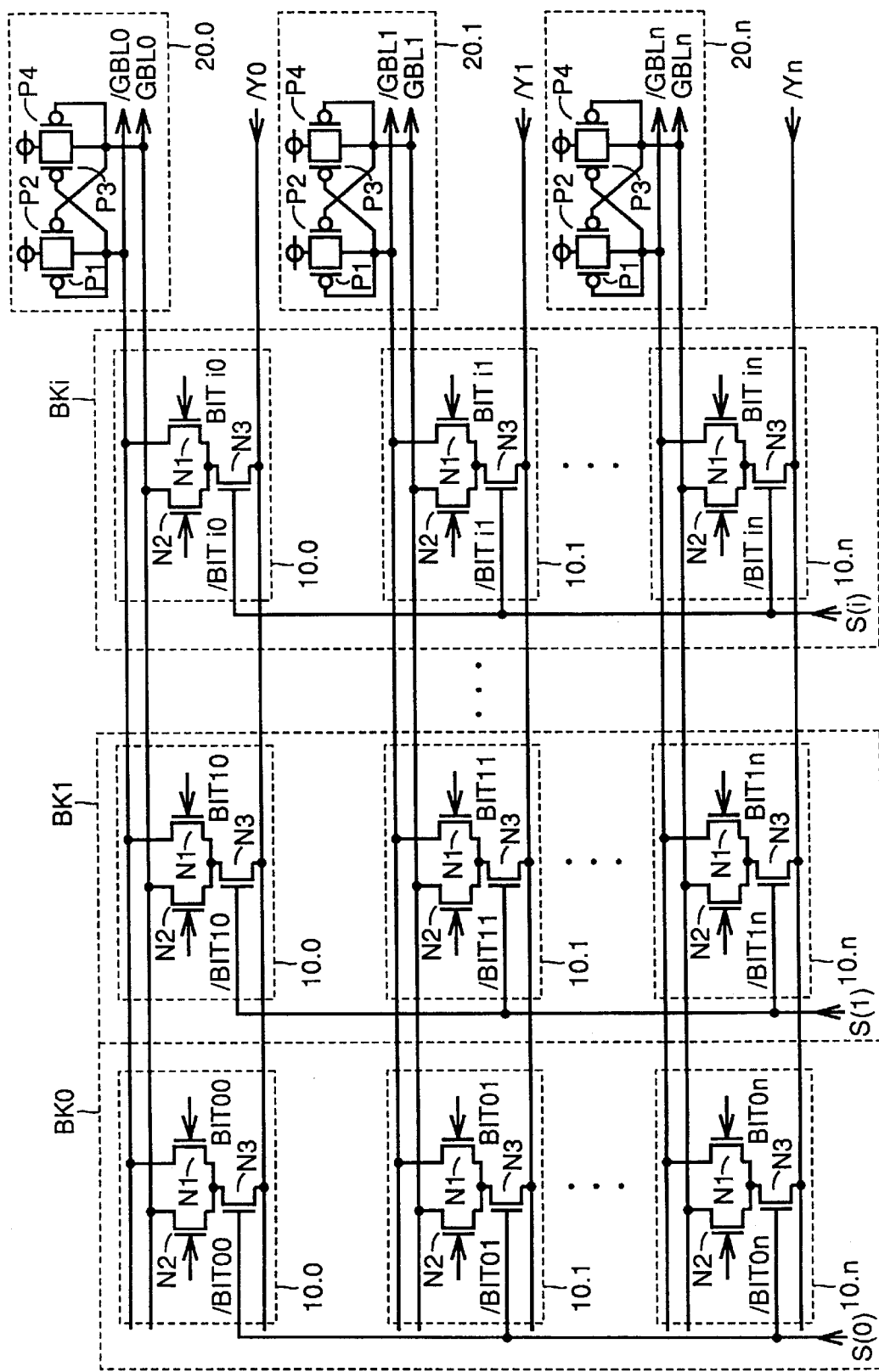
FIG. 5 shows a relationship between load circuits 20 and input circuits 10 in each memory block of the embodiment 1 of the invention.

FIG. 5 shows a relationship between load circuit 20 and input circuit 10 in each memory block BK of the embodiment 1 of the invention. As shown in FIG. 5, memory blocks BK commonly use load circuit 20.

Input circuits 10 in memory blocks BK are activated in response to block-corresponding sense amplifier activating signals S(0), S(1), . . . and S(i) issued from the corresponding activating circuits, respectively.

Each load circuit 20 is connection to portions of corresponding global bit line pair GBL and /GBL near the input nodes of transfer gate peripheral circuit 6.

Figure 27:
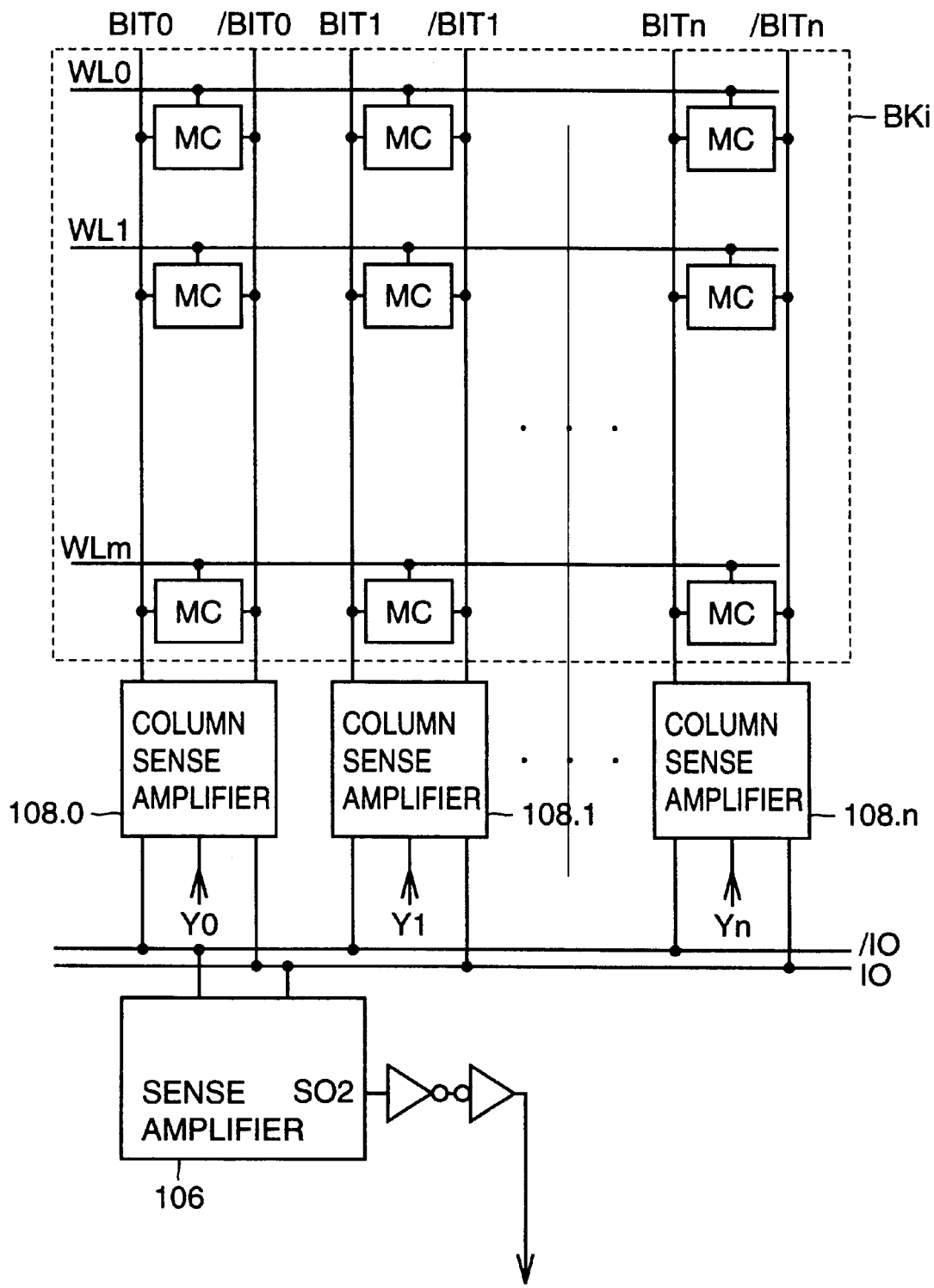
FIG. 27 shows a structure of a major portion of a conventional SRAM 9000 of a column sense type.
Figure 28:
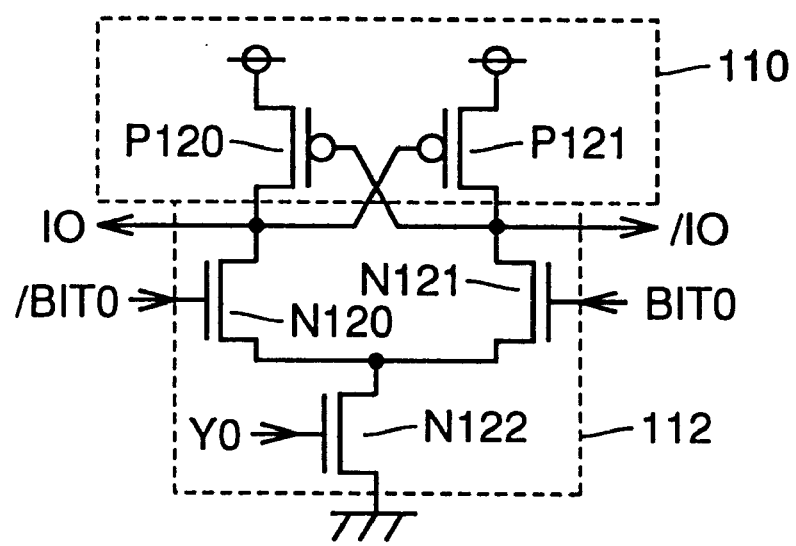
FIG. 28 is a circuit diagram showing an example of a specific structure of a conventional column sense amplifier 108 shown in FIG. 27.

The input portion (internal circuit 10) of the column sense amplifier is arranged for each memory block BL, and the load portion (Goad circuit 20) of the column sense amplifier is commonly used by the memory blocks. Thereby, the load circuits of the column sense amplifier is significantly reduced in number compared with conventional SRAM 9000 of the column sense amplifier type shown in FIG. 27. Input circuit 10 is formed of the NMOS transistors, and load circuit 20 is formed of the PMOS transistors.

Figure 6A:
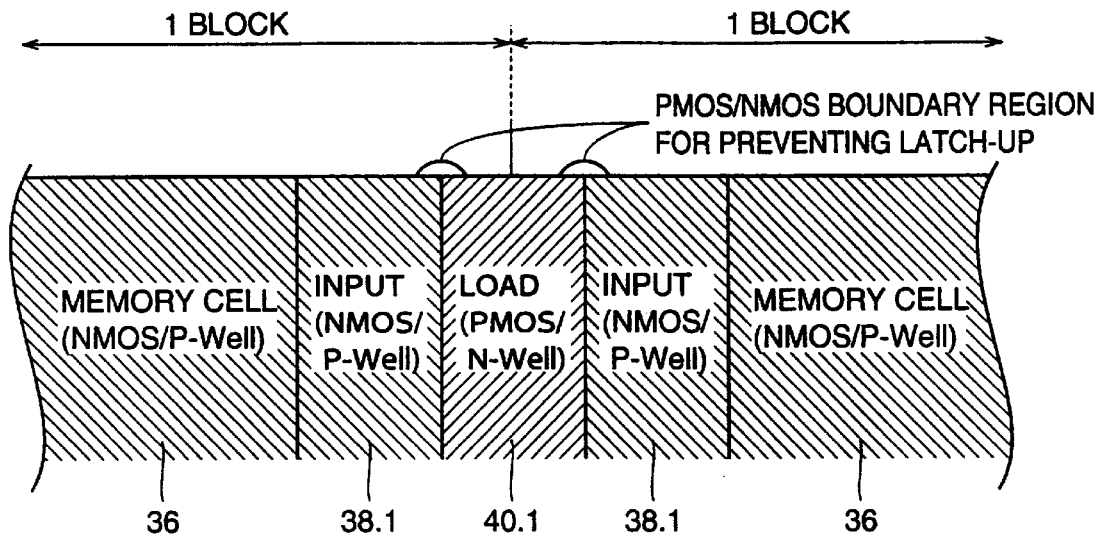
FIG. 6A shows structures of memory blocks in the prior art.
Figure 6B:
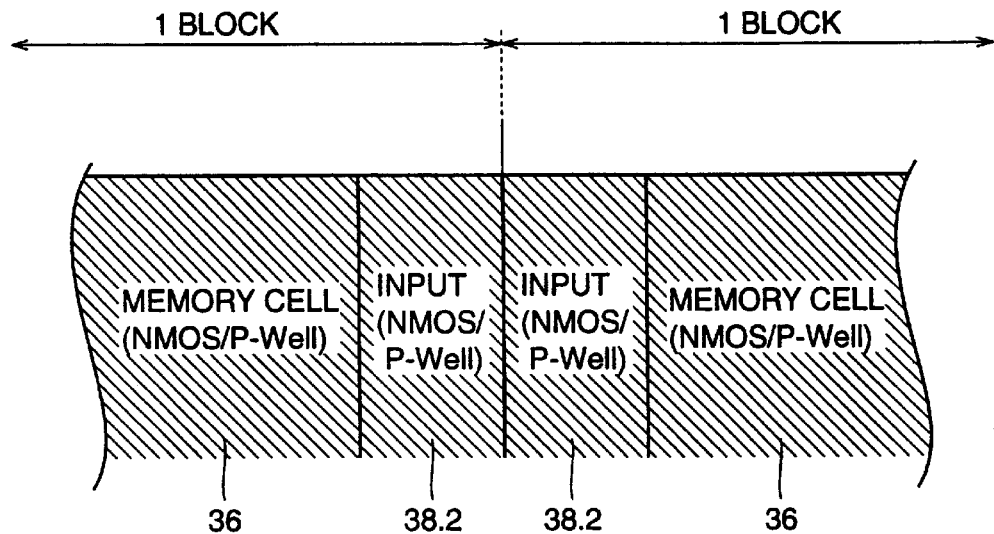
FIG. 6B shows structures of memory blocks of the embodiment 1 of the invention.

FIG. 6A shows structures of the memory blocks in conventional SRAM 9000 of the column sense type, and FIG. 6B shows structures of the memory blocks in semiconductor memory device 1000 of the embodiment 1 of the invention.

In FIGS. 6A and 6B, a reference number "36" indicates a region of the memory cell, and reference numbers "38.1" and "38.2" indicate input portions (input circuits 10) of the column sense amplifiers. A reference number "40.1" indicates the load portion (load circuit 20) of the column sense amplifier.

Figure 25:
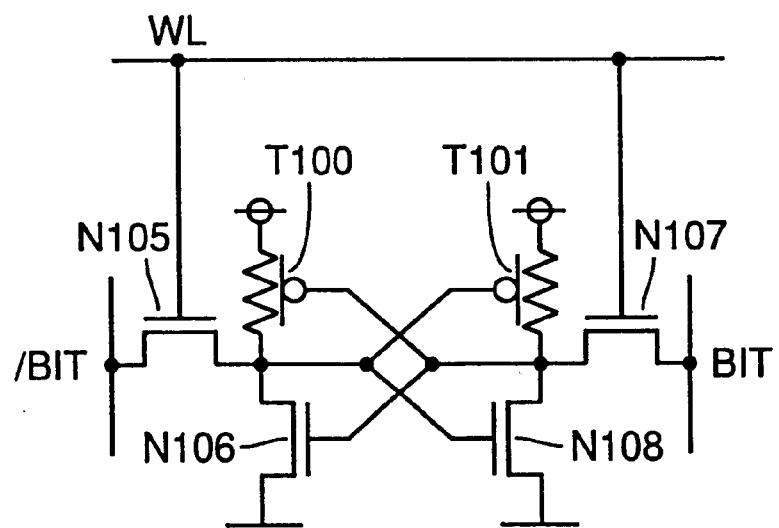
FIG. 25 shows a structure of a conventional memory cell of a TFT load type.
Figure 26:
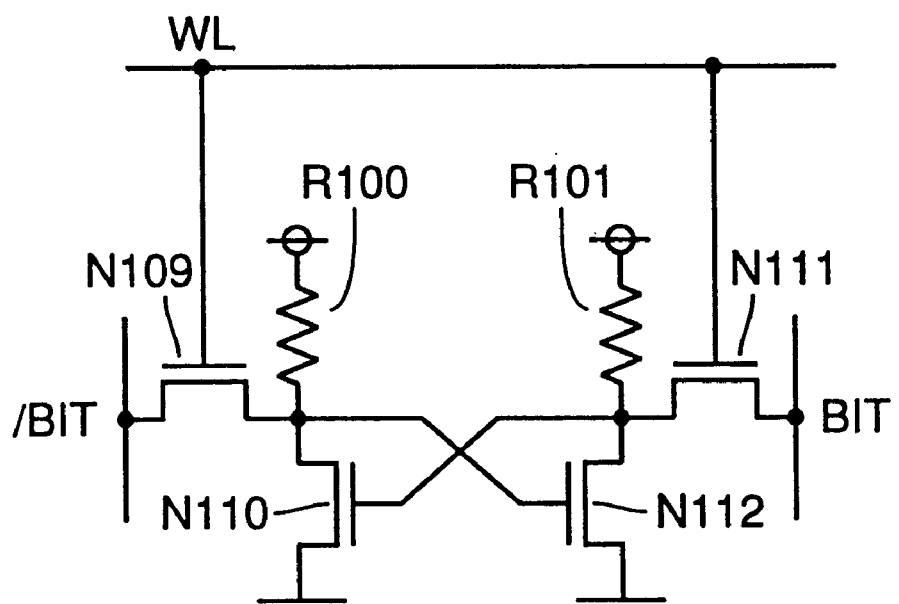
FIG. 26 shows a structure of a conventional memory cell of a high-resistance load type.

As memory cells MC, the memory cells of the TFT load type shown in FIG. 25 or the memory cells of the high-resistance load type shown in FIG. 26 are used. In this case, memory cells MC (indicated by "36" in FIGS. 6A and 6B) are formed on the P-well region.

Referring to FIG. 6A, conventional SRAM 9000 of the column sense type is provided at the memory block with the input portion and the load portions. In this structure, the input portion is formed of NMOS transistors, and the load portion is formed of PMOS transistors. Therefore, it is necessary to provide a P-well/N-well boundary region between each input portion 38.1 and load portion 40.1 for preventing latch-up.

In the semiconductor memory device 1000 of the embodiment 1 of the invention, the memory block does not contain load portion 40.1. Therefore, the area of memory block is reduced by an extent corresponding to load portion 40.1. It is not necessary to provide the P-well/N-well boundary region for preventing latch-up at input portion 38.2. According to semiconductor memory device 1000 of the embodiment 1 of the invention, therefore, the chip area can be significantly reduced compared with conventional SRAM 9000 of the column sense type.

The structure of each memory block in the embodiment 1 of the invention will be described below more in detail with reference to FIGS. 7 and 8.

Figure 7:
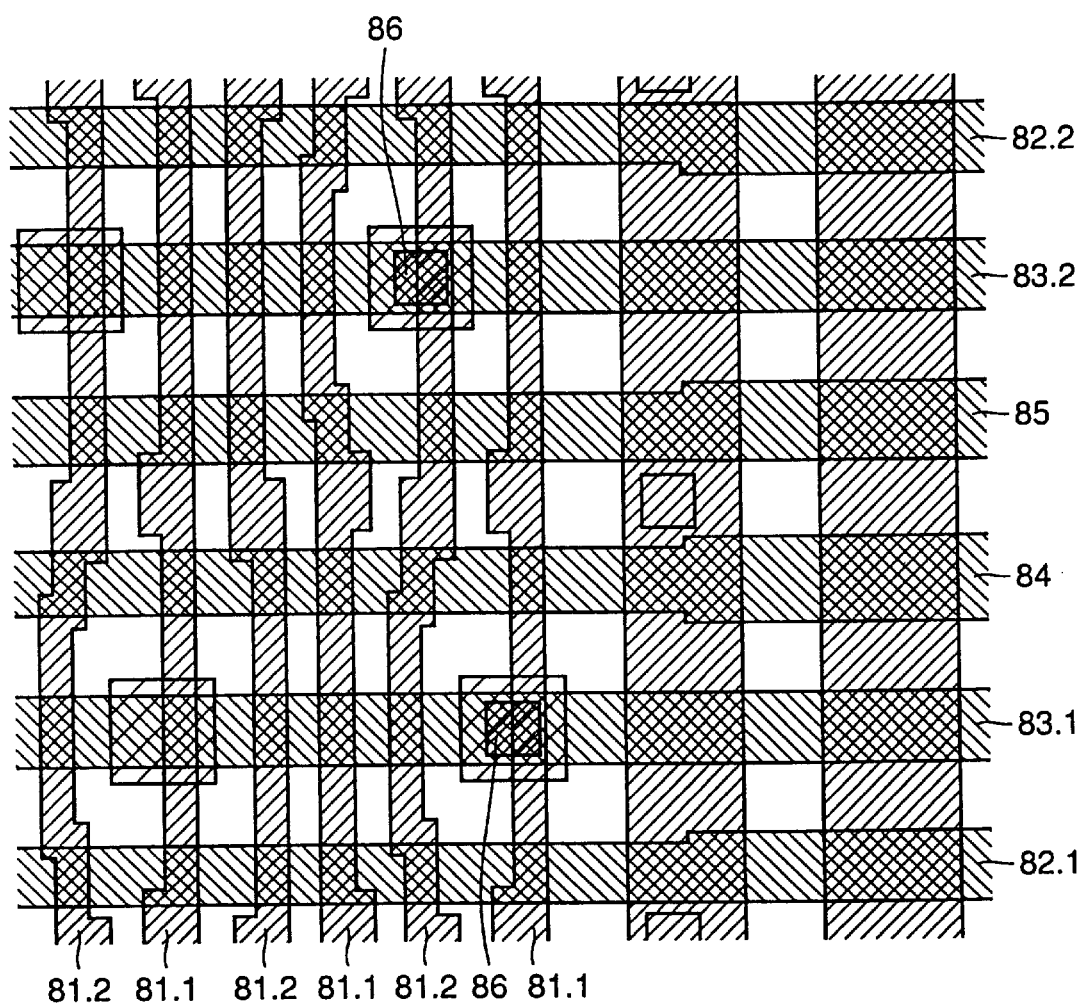
FIG. 7 is a plan showing a structure of a major portion of the memory block of the embodiment 1 of the invention.

In FIG. 7, bit line pair BIT and /BIT is formed of metal interconnections (reference numbers "81.1" and "81.2") of a first layer. Global bit line GBL (reference number "82.1"), global bit line /GBL (reference number "82.2"), a Y-decode line (reference number "84") transmitting Y-address signal /Y and a main word line (reference number "85") transmitting main address signal /MAIN are formed of metal interconnections of a second layer, respectively. Each of the metal interconnections of the second layer cross the metal interconnections of the first layer at a different level.

A reference number "86" indicates a portion corresponding to a contact hole for connecting the metal interconnections of the first and second layers together. A leader line (reference number "83.1") of bit line BIT and a leader line (reference "83.2") of bit line /BIT are formed of metal interconnections of the second layer.

Figure 8:
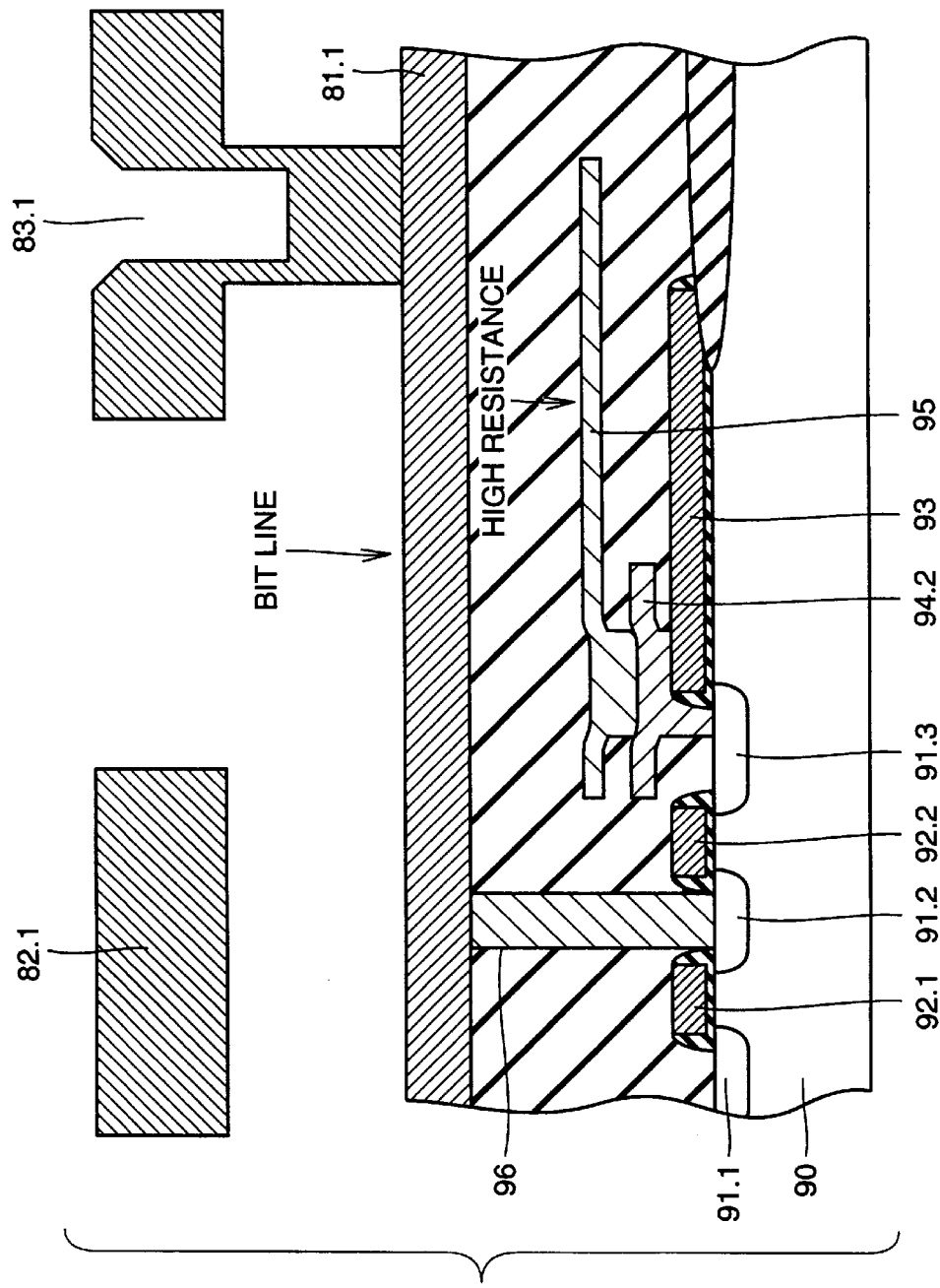
FIG. 8 is a cross section taken along a bit line in FIG. 7.

FIG. 8 is a cross section taken along the bit line shown in FIG. 7, and shows a structure using the memory cells of the high-resistance load type shown in FIG. 26.

In FIG. 8, diffusion regions 91.1, 91.2 and 91.3 are formed on a substrate 90 with a predetermined space between each other.

A polycrystalline silicon region 92.2 of the first layer is formed on a region between diffusion regions 91.2 and 91.3. Region 92.2 corresponds to word line WL connected to the gate electrode of NMOS transistor N111. A polycrystalline silicon region 93 of the first layer is formed in a neighboring portion. Region 93 corresponds to the gate electrode of NMOS transistor N112. A polycrystalline silicon region 92.1 of the first layer is formed in a region between diffusion regions 91.1 and 91.2. Region 92.1 corresponds to word line WL connected to neighboring memory cell MC.

A high resistance region 95 is formed on the structure with polycrystalline silicon 94.2 of a second layer therebetween. Region 95 corresponds to a resistor R101. A plug 96 is formed on diffusion region 91.2.

Bit line BIT which is metal interconnection 81.1 of the first layer is formed above plug 96. Metal interconnection 83.1 of the second layer is formed for providing the leader line extending from metal interconnection 81.1 of the first layer, and metal interconnections 82.1, . . . of the second layer are formed for providing global bit line GBL and others.

Figure 9:
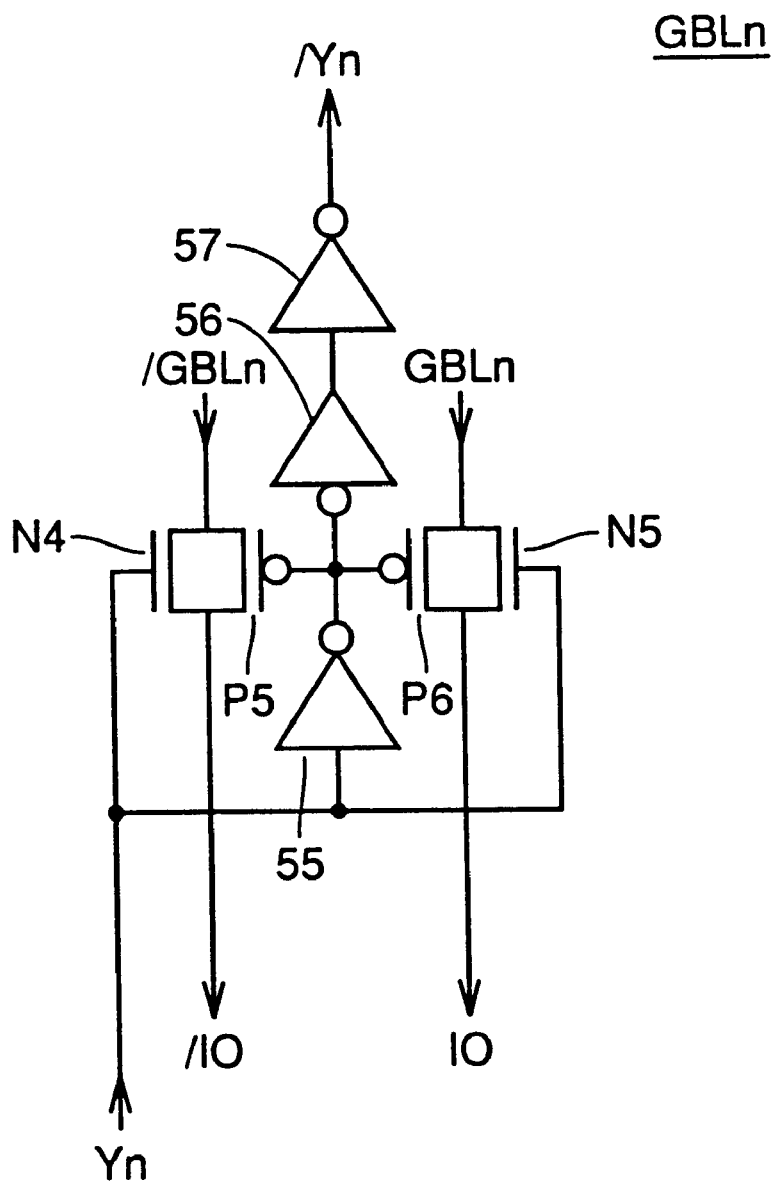
FIG. 9 is a circuit diagram showing an example of a specific structure of a transfer gate TG shown in FIG. 2.

A structure of transfer gate TG shown in FIG. 2 will be described below with reference to FIG. 9. FIG. 9 representatively shows a structure of transfer gate TGn connected to global bit line pair GBLn and /GBLn. Other transfer gates TG have the same structures as transfer gate TGn shown in FIG. 9.

Transfer gate TGn shown in FIG. 9 includes NMOS transistors N4 and N5, PMOS transistors P5 and P6, and inverter circuits 55, 56 and 57.

NMOS transistor N4 and PMOS transistor P5 are connected between corresponding global bit line /GBLn and data I/O line /IO. NMOS transistor N5 and PMOS transistor P6 are connected between corresponding global bit line GBLn and data I/O line IO. Each of NMOS transistors N4 and N5 receives corresponding Y-address signal Yn on its gate electrode. Inverter circuit 55 receives Y-address signal Yn on its input. The output node of inverter circuit 55 is connected to PMOS transistors P5 and P6 and the input node of inverter circuit 56. The output node of inverter circuit 56 is connected to the input node of inverter circuit 57. Inverter circuit 57 issues Y-address signal /Yn by inverting received Y-address signal Yn.

In the read operation, when Y-address signal Yn rises to H-level, NMOS transistors N4 and N5 are turned on, and signals on global bit lines GBLn and /GBLn are sent onto data I/O line pair IO and /IO, respectively.

In the write operation, when Y-address signal Yn rises to H-level, NMOS transistors N4 and N5 are turned on, and data on data I/O line pair IO and /IO is transmitted onto global bit line pair BGLn and /GBLn, respectively.

A structure of sense amplifier SA1 shown in FIG. 2 will be described below with reference to FIG. 10.

Figure 10:
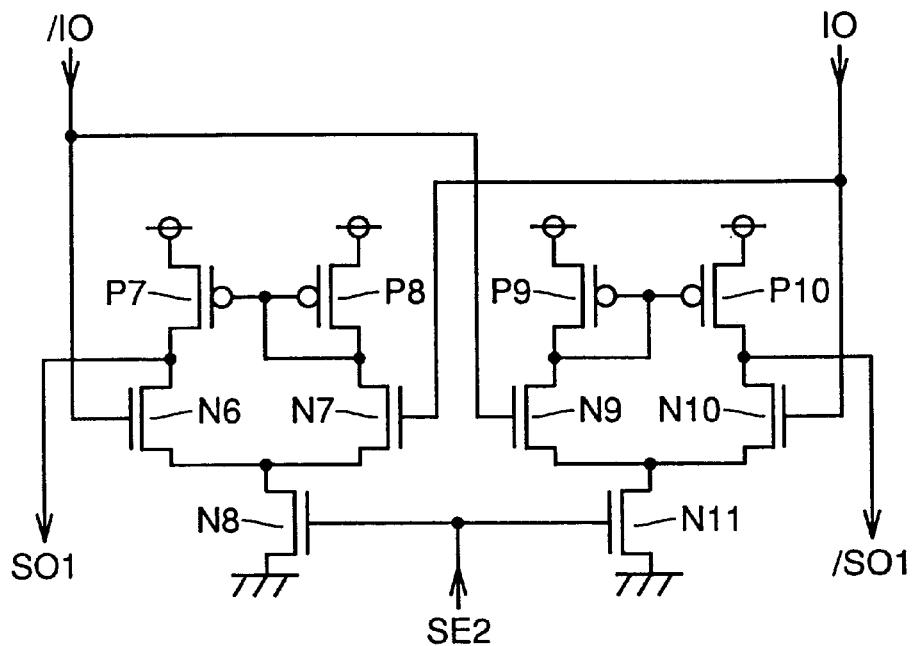
FIG. 10 is a circuit diagram showing an example of a specific structure of a sense amplifier SA1 shown in FIG. 2.

Sense amplifier SA1 shown in FIG. 10 includes NMOS transistors NG, N7, N8, N9 and N10 as well as PMOS transistors P7, P8, P9 and P10.

Sense amplifier SA1 is formed of a differential amplifier of a current mirror type. PMOS transistor P7 and NMOS transistor NG are connected in series between the power supply potential and one of conductive terminals of NMOS transistor N8. PMOS transistor P8 and NMOS transistor N7 are connected in series between the power supply potential and one of conductive terminals of NMOS transistor N8. The other conductive terminal of NMOS transistor N8 is connected to the ground potential.

PMOS transistor P9 and NMOS transistor N9 are connected in series between the power supply potential and one of conductive terminals of NMOS transistor N11. PMOS transistor P10 and NMOS transistor N10 are connected in series between the power supply potential and one of conductive terminals of NMOS transistor N11. The other conductive terminal of NMOS transistor N11 is connected to the ground potential.

Each of NMOS transistors N8 and N11 receives sense amplifier activating signal SE2 on its gate electrode. The gate electrode of each of NMOS transistors NG and N9 is connected to data I/O line /IO. The gate electrode of each of NMOS transistors N7 and N11 is connected to data I/O line IO.

The gate electrode of each of PMOS transistors P7 and P8 is connection to the connection node between PMOS transistor P8 and NMOS transistor N7. The gate electrode of each of PMOS transistors P9 and P10 is connection to the connection node between PMOS transistor P9 and NMOS transistor N9. Amplified signal SO1 is issued from the connection node between PMOS transistor P7 and NMOS transistor N6. An inverted signal /SO1 is issued from the connection node between PMOS transistor P10 and NMOS transistor N10.

Thereby, sense amplifier SA1 amplifies the potential difference on data I/O line pair IO and /IO, and issues signal /SO1 and inverted signal /SO1.

A structure of sense amplifier SA2 shown in FIG. 2 will be described below with reference to FIG. 11.

Figure 11:
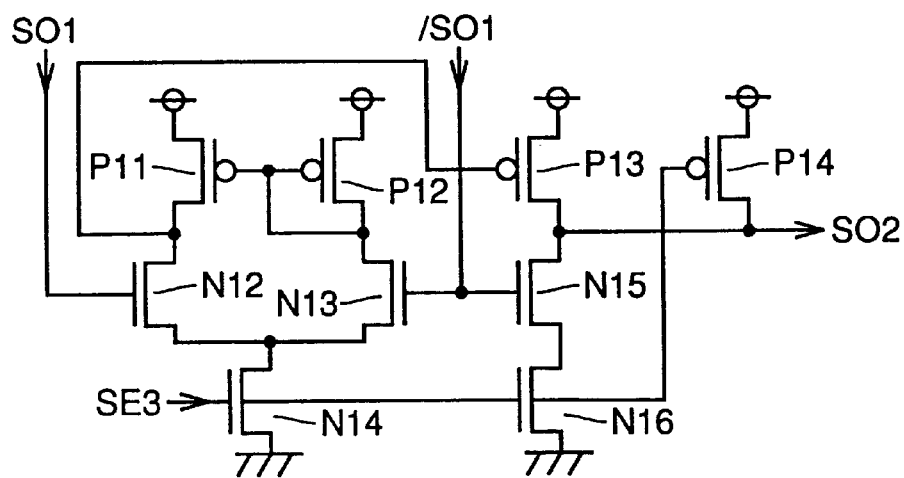
FIG. 11 is a circuit diagram showing an example of a specific structure of a sense amplifier SA2 shown in FIG. 2.

Sense amplifier SA2 shown in FIG. 11 includes NMOS transistors N12, N13, N14, N15 and N16 as well as PMOS transistors P11, P12, P13 and P14.

PMOS transistors P11 and P12 as well as NMOS transistors N12, N13 and N14 form a differential amplifier. PMOS transistor P11 and NMOS transistor N12 are connected in series between the power supply potential and one of conductive terminals of NMOS transistor N14. PMOS transistor P12 and NMOS transistor N13 are connected in series between the power supply potential and one of conductive terminals of NMOS transistor N14.

The other conductive terminal of NMOS transistor N14 is connected to the ground potential. NMOS transistor N12 receives signal SO1 issued from sense amplifier SA1 on its gate electrode, and NMOS transistor N13 receives inverted signal /SO1 issued from sense amplifier SA1 on its gate electrode. NMOS transistor N14 receives sense amplifier activating signal SE3 on its gate electrode. The gate electrode of each of PMOS transistors P11 and P12 is connected to the connection node between PMOS transistor P12 and NMOS transistor N13.

PMOS transistor P13 and NMOS transistors N15 and N16 are connected in series between the power supply potential and the ground potential. NMOS transistor N16 receives sense amplifier activating signal SE3 on its gate electrode. NMOS transistor N15 receives inverted signal /SO1 issued from sense amplifier SA1 on its gate electrode. The gate electrode of PMOS transistor P13 is connected to the connection node between PMOS transistor P11 and NMOS transistor N12. PMOS transistor P14 is connected to the connection node between the power supply potential and the connection node between PMOS transistor P13 and NMOS transistor N15. Signal SO2 is issued from this node connected to PMOS transistor P14. PMOS transistor P14 receives sense amplifier activating signal SE3 on its gate electrode.

Figure 12:
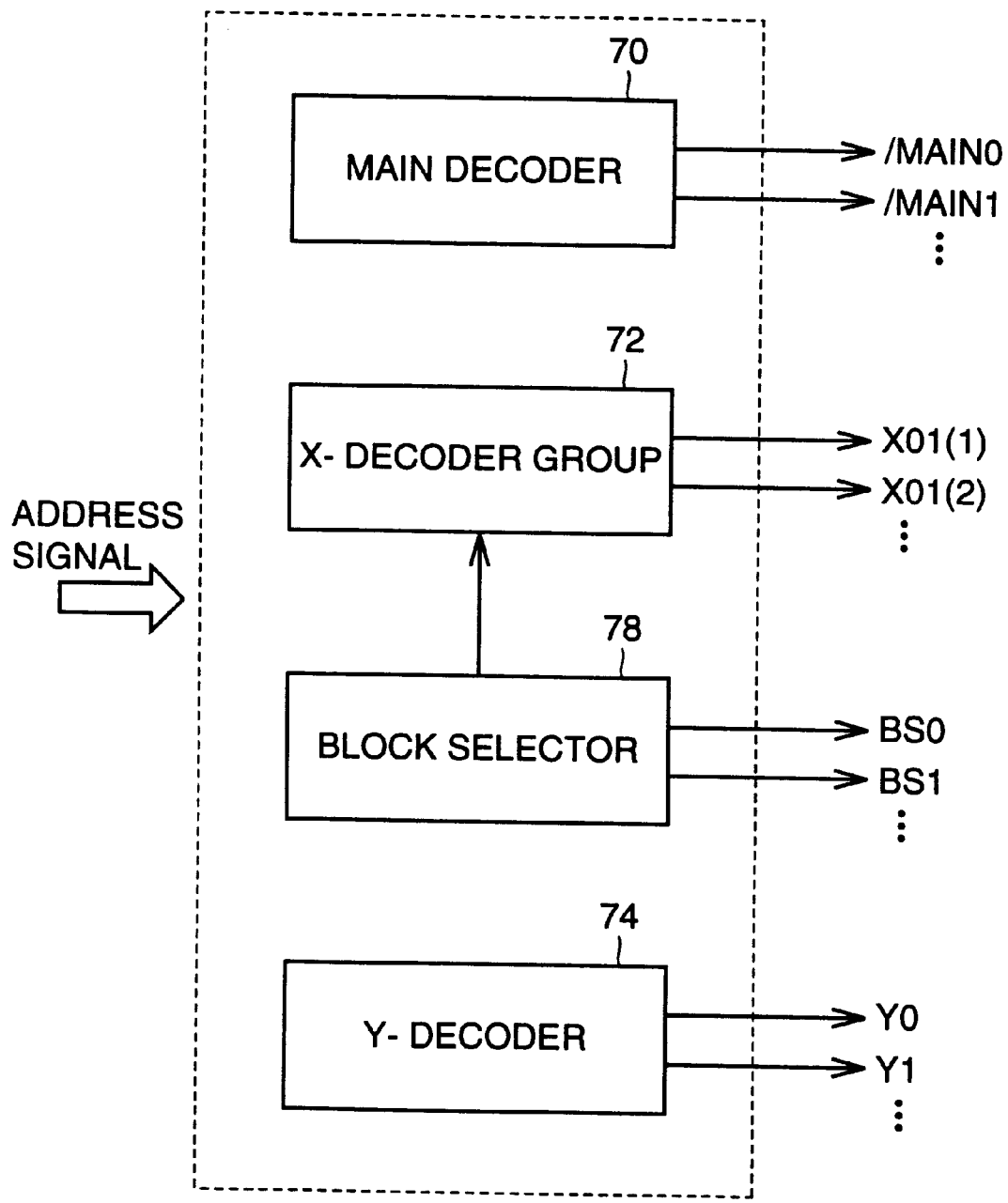
FIG. 12 is a block diagram showing an example of a specific structure of a decoder 2 shown in FIG. 1.

The structure of decoder 2 shown in FIG. 1 will be described below with reference to FIG. 12. FIG. 12 is a block diagram showing an example of a specific structure of decoder 2 shown in FIG. 1. As shown in FIG. 12, decoder 2 includes a main decoder 70, an X-decoder group 72, a Y-decoder 74 and a block selector 78.

Main decoder 70 issues main address signals /MAIN0, /MAIN1, . . . in response to the address signal sent from I/O peripheral circuit 4.

X-decoder group 72 issues X-address signals X01(1), X01(2), . . . in response to the address signal sent from I/O peripheral circuit 4.

Y-decoder 74 issues Y-address signals Y0, Y1, . . . in response to the address signal sent from I/O peripheral circuit 4. Block selector 78 issues block select signals BS0, BS1, . . . to corresponding memory blocks BK1, BK2, in response to the address signal sent from I/O peripheral circuit 4, respectively.

A structure of a main decoder 70 included in decoder 2 shown in FIG. 12 will be described below with reference to FIG. 13.

Figure 13:
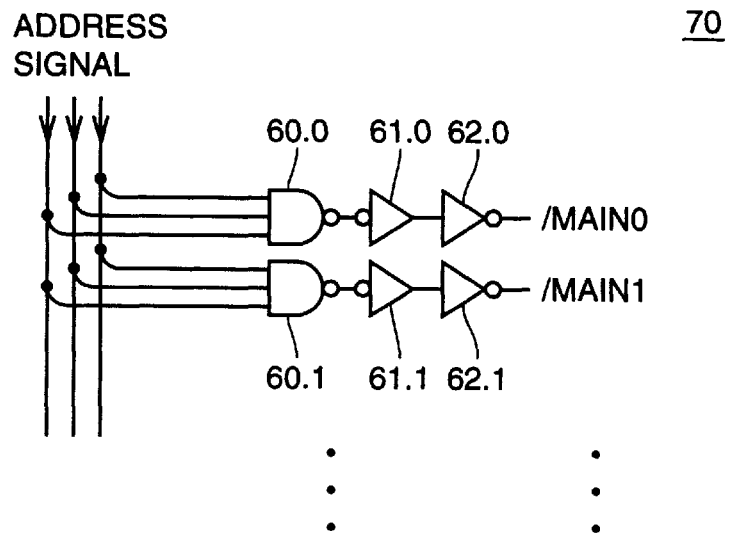
FIG. 13 shows an example of a specific structure of a main decoder 70 included in decoder 2 shown in FIG. 12.

Main decoder 70 shown in FIG. 13 operates in response to the address signal, and thereby sets main address signals /MAIN0, /MAIN1, . . . which correspond to the higher address signal of the memory cell to be selected, to the L-level and thus the active state.

The main decoder 70 shown in FIG. 13 includes a plurality of NAND circuits 60.0, 60.1, . . . , a plurality of inverter circuits 61.0, 61.1, . . . , and a plurality of inverter circuits 62.0, 62.1, . . . .

Inverter circuits 61.0, 61. 1, . . . and inverter circuits 62.0, 62.1, . . . are provided correspondingly to NAND circuits 60.0, 60.1, . . . , respectively.

Each of NAND circuits 60.0, 60.1, . . . receives the address signal from I/O peripheral circuit 4 shown in FIG. 1. Inverter circuits 61.0, 61.1, . . . invert the signals sent from corresponding NAND circuits 60.0, 60.1, . . . for outputting the result, respectively. Inverter circuits 62.0, 62.1, . . . invert the signals sent from corresponding inverter circuits 61.0, 61.1, . . . , and thereby issue main address signals /MAIN0, /MAIN1, . . . , respectively.

Main address signals /MAIN are transmitted to memory blocks BK through the main word lines, respectively.

A structure of X-decoder group 72 included in decoder 2 shown in FIG. 12 will be described below with reference to FIG. 14.

Figure 14:
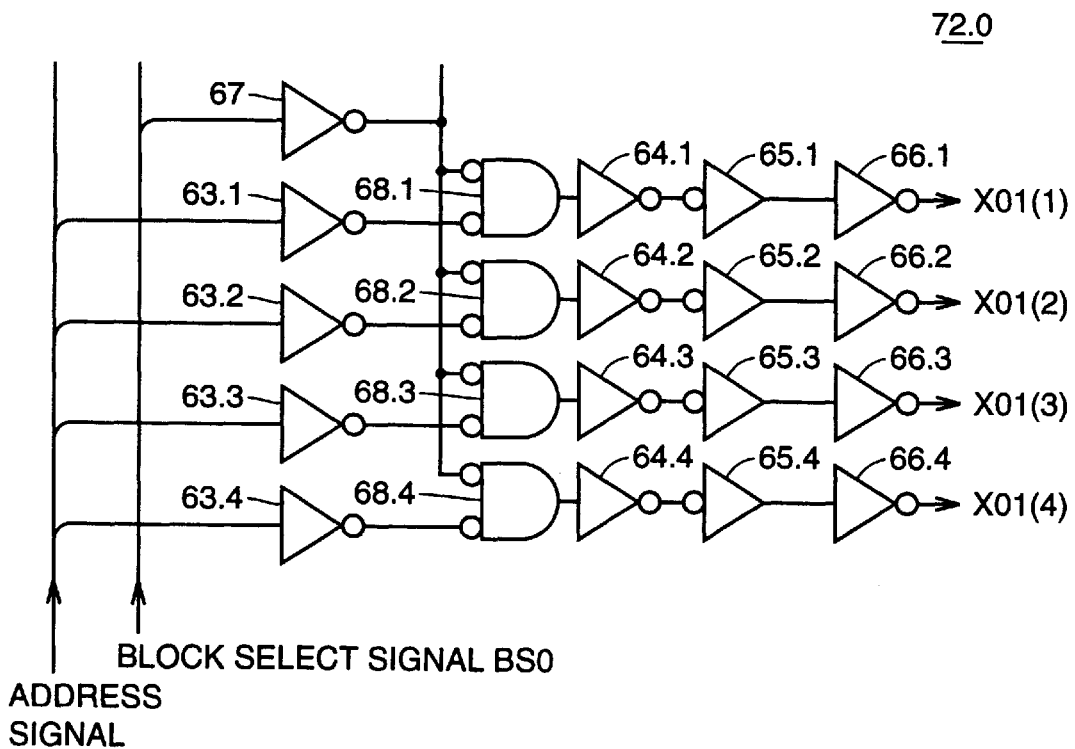
FIG. 14 shows an example of a specific structure of an X-decoder group 72 included in decoder 2 shown in FIG. 12.

The circuit shown in FIG. 14 is X-decoder 72.0 corresponding to memory block BK0 included in X-decoder group 72. The X-decoders corresponding to the other memory blocks BK have the same structures as that shown in FIG. 14.

X-decoder 72.0 includes a plurality of inverter circuits 63.1, 63.2, 63.3 and 63.4, a plurality of inverter circuits 64.1, 64.2, 64.3 and 64.4, a plurality of inverter circuits 65.1, 65.2, 65.3 and 65.4, a plurality of inverter circuits 66.1, 66.2, 66.3 and 66.4, an inverter circuit 67, and NOR circuits (gate circuits) 68.1, 68.2, 68.3 and 68.4 of a negative logic.

Inverter circuit 67 receives corresponding block select signal BS0 on its input, and inverts the result. Each of inverter circuits 63.1, 63.2, . . . receives on its input the corresponding address signal.

The gate circuits 68.1, 68.2, . . . are provided correspondingly to inverter circuits 63.1, 63.2, . . . respectively. Gate circuits 68.1, 68.2, . . . receive the inverted signal of block select signal BS0, and also receive the signals sent from corresponding inverter circuits 63.1, 63.2, . . . respectively.

Inverter circuits 64.1, 64.2, . . . are provided correspondingly to gate circuits 68.1, 68.2, . . . respectively. Inverter circuits 64.1, 64.2, . . . invert the outputs of corresponding gate circuits 68.1, 68.2, . . . and output the results, respectively.

Inverter circuits 65.1, 65.2, . . . are provided correspondingly to gate circuits 64.1, 64.2, . . . , respectively. Inverter circuits 65.1, 65.2, . . . invert the outputs of corresponding inverter circuits 64.1, 64.2, . . . and output the results, respectively.

Inverter circuits 66.1, 66.2, . . . are provided correspondingly to gate circuits 65.1, 65.2, . . . , respectively. Inverter circuits 66.1, 66.2, . . . invert the outputs of corresponding inverter circuits 65.1, 65.2, . . . and output the results, respectively.

In FIG. 14, inverter circuit 66.1 issues X-address signal X01(1), and inverter circuit 66.2 issues X-address signal X01(2). Inverter circuit 66.3 issues X-address signal X01(3), and inverter circuit 66.4 issues X-address signal X01(4).

An operation of semiconductor memory device 1000 of the embodiment 1 of the invention will now be described below.

As an example, description will be given on the case where data at H-level is to be read from memory cell MC at the crossing between word line WL0 and bit line pair BITi0 and /BITi0. All bit line pairs BIT and /BIT as well as all global bit line pairs GBL and /GBL are equalized in advance to the equal potential.

In response to the externally applied address signal, corresponding block select signal BSi attains H-level, and both X-address signal X01(0) and main address signal /MAIN0 attain L-level. Thereby, word line WL0 rises to H-level.

Data is sent from the plurality of memory cells MC connected to word line WL0 onto corresponding bit line pairs BITi0 and /BITi0, respectively. The potential on bit line /BITi0 lowers below that on bit line BITi0 so that a potential difference occurs between bit lines BITi0 and /BITi0.

In accordance with block select signal BSi and sense amplifier activating signal SE1, activating circuit 34 issues block-corresponding sense amplifier activating signal S(i) at H-level. Thereby, NMOS transistors N3 are turned on in all internal circuits 10 of block BKi.

In accordance with the externally applied address signal, Y-address signal Y0 corresponding to the selected column attains H-level. Y-address signal /Y0 at L-level is issued from transfer gate TG0. Other Y-address signals /Y stay at H-level.

Input circuit 10.0 in memory block BKi lowers the potential on corresponding global bit line /GBL0 below the potential on corresponding global bit line GBL0. Load circuit 20.0 increases this potential difference.

Through input circuit 10.0 and load circuit 20.0, the signal on global bit lines pair GBL0 and /GBL0 is amplified to have an amplitude larger than that on bit line pair BITi0 and /BITi0, respectively.

No change occurs in potentials on global bit line pairs GBL and (GBL corresponding to the other and thus unselected columns.

Then, the amplified data on global bit line pair GBL0 and /GBL0 is transmitted onto data I/O line pair IO and /IO through transfer gate TG0. The data on data I/O line pair IO and /IO is amplified by sense amplifiers SA1 and SA2, and is output from the device through I/O peripheral circuit 4 shown in FIG. 1.

According to semiconductor memory device 1000 of the embodiment 1 of the invention, the column sense method is employed. Therefore, the memory cell drives only the bit line pair connected thereto, and is not required to drive the global bit line pair and the interconnections following the same. Therefore, the signal on the bit line pair can have a fast amplitude, and therefore fast data reading can be performed.

Figure 23:
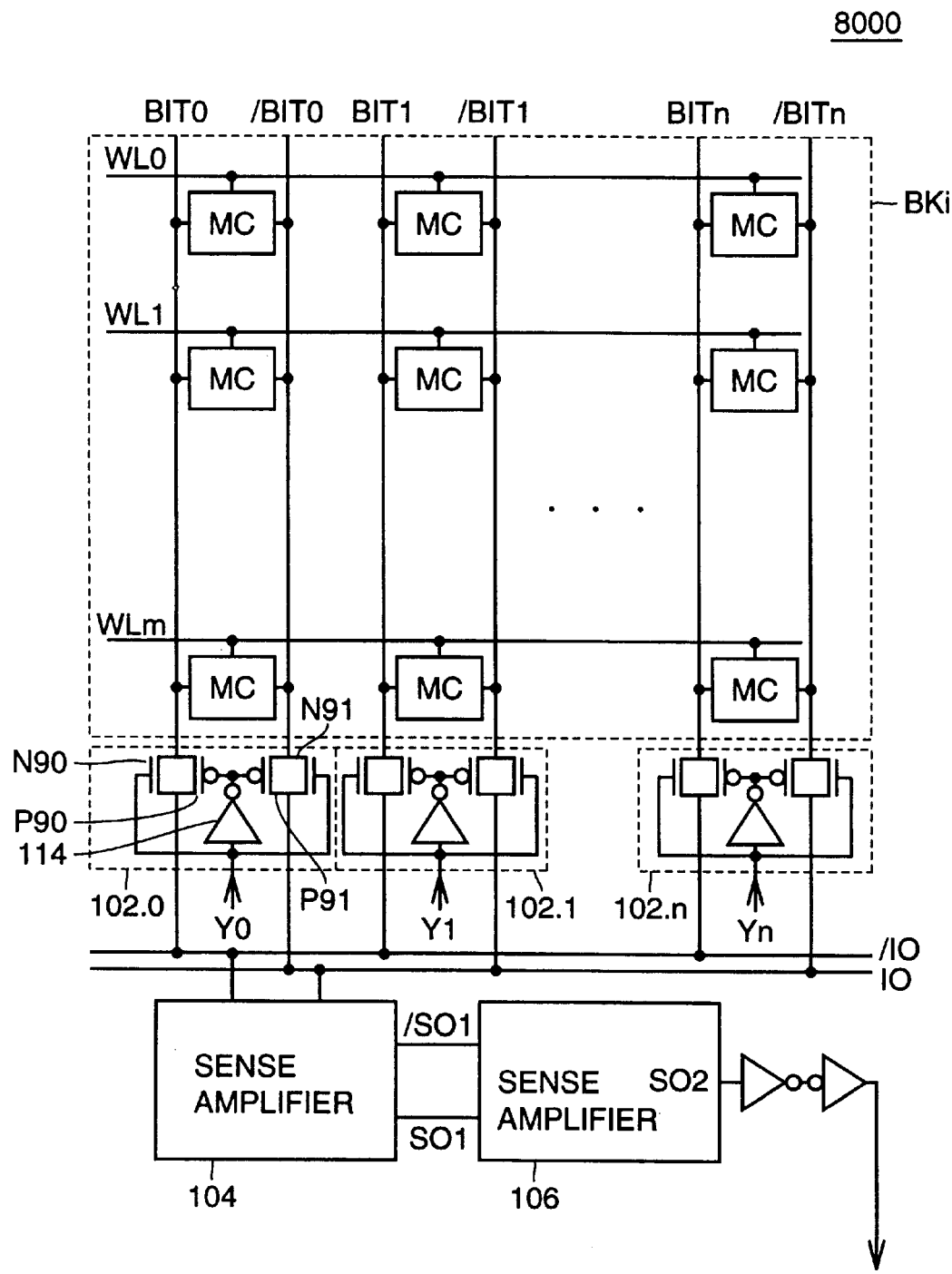
FIG. 23 is a circuit diagram showing a structure of a major portion of a conventional SRAM 8000.
Figure 24:
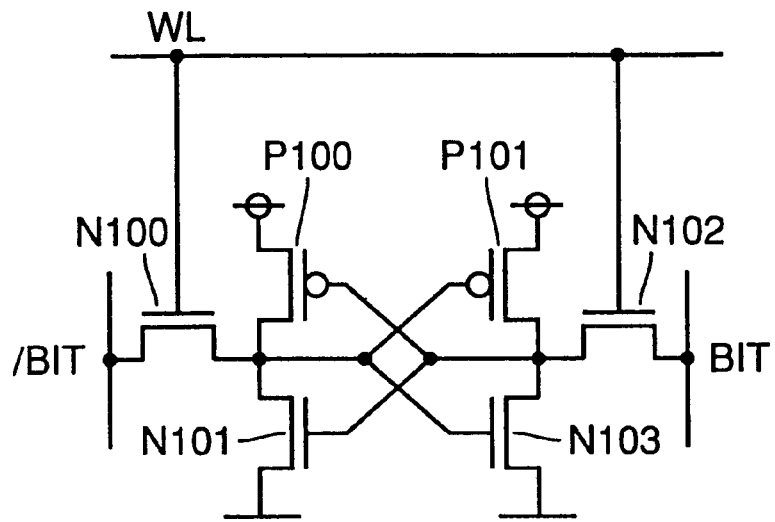
FIG. 24 shows a structure of a conventional memory cell of a full-CMOS type.

In conventional semiconductor memory device 8000 (FIG. 23), the elements, i.e., inverter circuit and transistors which are arranged between the memory cell array and the data I/O line pair are six in total number. Meanwhile, the semiconductor memory device 1000 of the embodiment 1 of the invention uses only three elements, i.e., the NMOS transistors and transfer gate TG so that the column sense method can be employed with a substantially equal area.

Further, conventional semiconductor memory device 9000 (FIG. 27) of the column sense method requires the two elements (PMOS transistors), the three elements (NMOS transistors) and the transfer gate for writing. Meanwhile, according to semiconductor memory device 1000 of the embodiment 1 of the invention, the column sense amplifier can be formed with a smaller area.

In the memory cells using the miniaturizing process in recent years, even a very minute foreign matter may cause a short circuit. For example, semiconductor memory device 1000 of the embodiment 1 of the invention requires various metal interconnections of the second layer on the memory cell array, and more specifically requires the interconnections of (m+1)/4 in number for the main word lines, the interconnections of (n+1)×2 in number for the bit lines and the global bit lines, and interconnections of (n+1) in number for the Y-decode lines. The following formula (1) represents the total number of all the required interconnections:

$$(m+1)/4+(n+1)\times 4+(n+1)=(m+1)/4+(n+1)\times 5 \quad (1)$$

Generally, a low consumption SRAM has a structure of 512 rows by 128 columns (m=511, n=127). Therefore, the interconnections are 768 in number.

When converting this based on a width of one bit of memory cell, the number of interconnections is 768/512= 1.5. In recent SRAMs using the miniaturizing process, the memory cell size is about 3 µm and thus is very small. Therefore, the metal interconnections of the second layer are arranged at a pitch of 1.5 interconnections per a width of 3 µm and thus 1 interconnection per 2 µm. This pitch is very severe for the metal interconnections of the second layer. Consequently, even a minute foreign matter causes a short circuit, resulting in reduction in yield.

Figure 15:
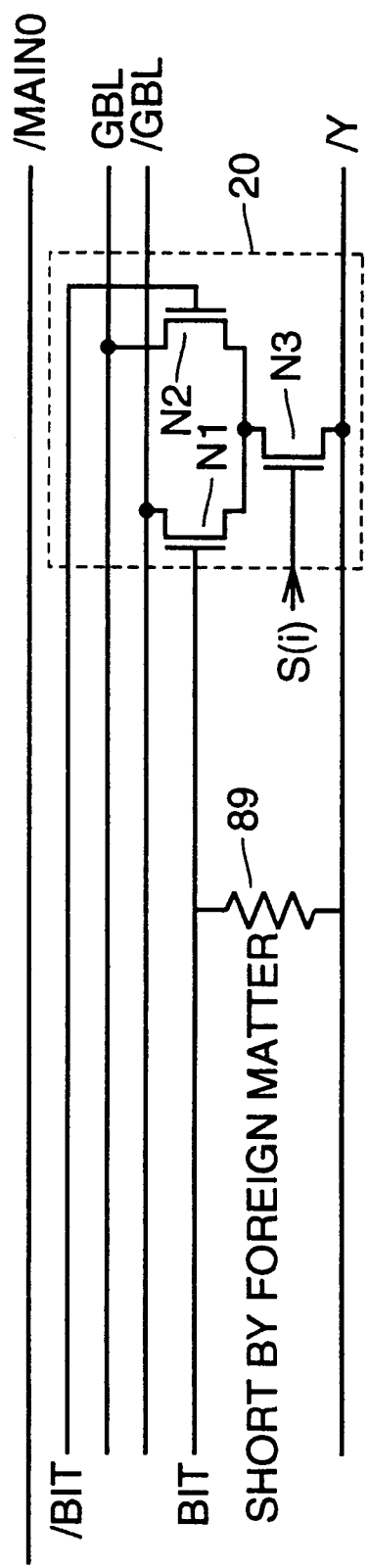
FIG. 15 is a diagram for showing an effect of the structure of the embodiment 1 of the invention.

For example, it is now assumed that a foreign matter is mixed into a circuit as shown in FIG. 15. FIG. 15 is a diagram for showing an effect of the structure of the embodiment 1 of the invention. As shown in FIG. 15, a foreign material (reference "89" in FIG. 15) having a high resistance may be mixed into input circuit 20 corresponding to bit line pair BIT and /BIT. If mixed, a leader line of bit line BIT may be coupled to a Y-decode line transmitting Y-address signal /Y.

In this case, no problem occurs in the operation of the circuit if short-circuited through a high resistance. However, in view of a low power consumption, a failure occurs in the standby current even if the current flows through a foreign matter of a high resistance.

In contrast to this, the embodiment 1 of the invention employs the bit line pairs formed of the metal interconnections of the first layer and also employs the global bit line pairs and the Y-decode lines which are made of the metal interconnections of the second layer. Further, during standby (non-operation), all the metal interconnections of the second layer are kept at the same potential and, in the embodiment 1 of the invention, H-level.

As described above, the standby current can be suppressed and an intended yield can be achieved even if a foreign matter of a high resistance in mixed between the interconnections as shown in FIG. 15.

[Embodiment 2]

An internal circuit and a load circuit corresponding to a column sense amplifier in an embodiment 2 of the invention will be described below with reference to FIG. 16.

Figure 16:
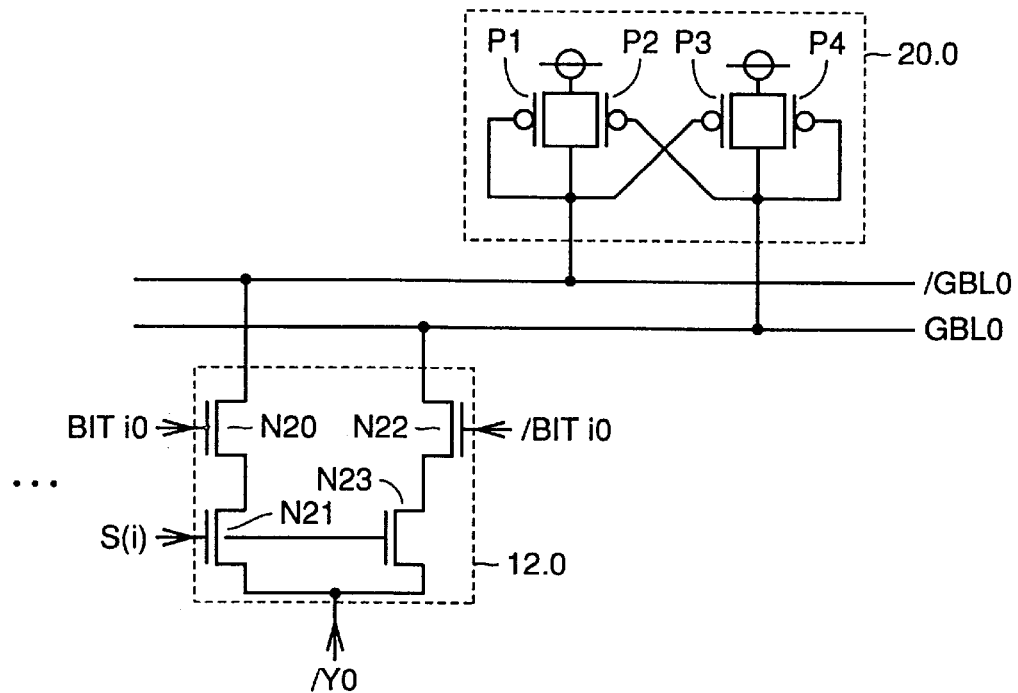
FIG. 16 shows an example of a specific structure of an input circuit corresponding to a column sense amplifier in an embodiment 2 of the invention.

FIG. 16 representatively shows an input circuit 12.0 in memory block BKi corresponding to global bit line pair GBL0 and /GBL0. For reference, a relationship with load circuit 20.0 is also shown. The other input circuits have the same structures as that shown in FIG. 16. All the input circuits will be generally referred to as input circuits 12.

In the embodiment 2 of the invention, input circuit 12 shown in FIG. 16 is used instead of input circuit 10 in the embodiment 1 of the invention.

Input circuit 12.0 in the embodiment 2 of the invention shown in FIG. 16 includes NMOS transistors N20, N21, N22 and N23.

NMOS transistors N20 and N21 are connected in series between corresponding global bit line /GBL0 and the Y-decode line transmitting corresponding Y-address signal /Y0.

NMOS transistors N22 and N23 are connected in series between corresponding global bit line GBL0 and the corresponding Y-decode line.

Each of NMOS transistors N21 and N23 receives corresponding block-corresponding sense amplifier activating signal S(i) on its gate electrode.

The gate electrode of NMOS transistor N22 is connected to corresponding bit line /BITi0. The gate electrode of NMOS transistor N20 is connected to corresponding bit line BITi0.

In each of input circuits 10 shown in FIG. 3, NMOS transistor N3 controls activation and deactivation of the circuit itself. It is now assumed that a signal is issued onto global bit lines GBL0 and /GBL0 during operation, and thereby the potential on global bit line /GBL0 lowers. In this case, the potential difference on bit line pair BITi0 and /BITi0 is extremely small, and all the transistors (N1 and N2) connected thereto are on. Thus, global bit lines GBL0 and /GBL0 are in the short-circuited state. Therefore, even the potential on global bit line GBL0 may unpreferably lower.

In the case of input circuit 12 shown in FIG. 16, transistors (NMOS transistors N21 and N23) receiving the block-corresponding sense amplifier activating signal are provided for each of bit line. Thereby, the short-circuit between the global bit lines can be prevented, and therefore current leakage can be prevented.

[Embodiment 3]

Description will be given on an input circuit and a load circuit corresponding to a column sense amplifier in an embodiment 3 of the invention with reference to FIG. 17.

Figure 17:
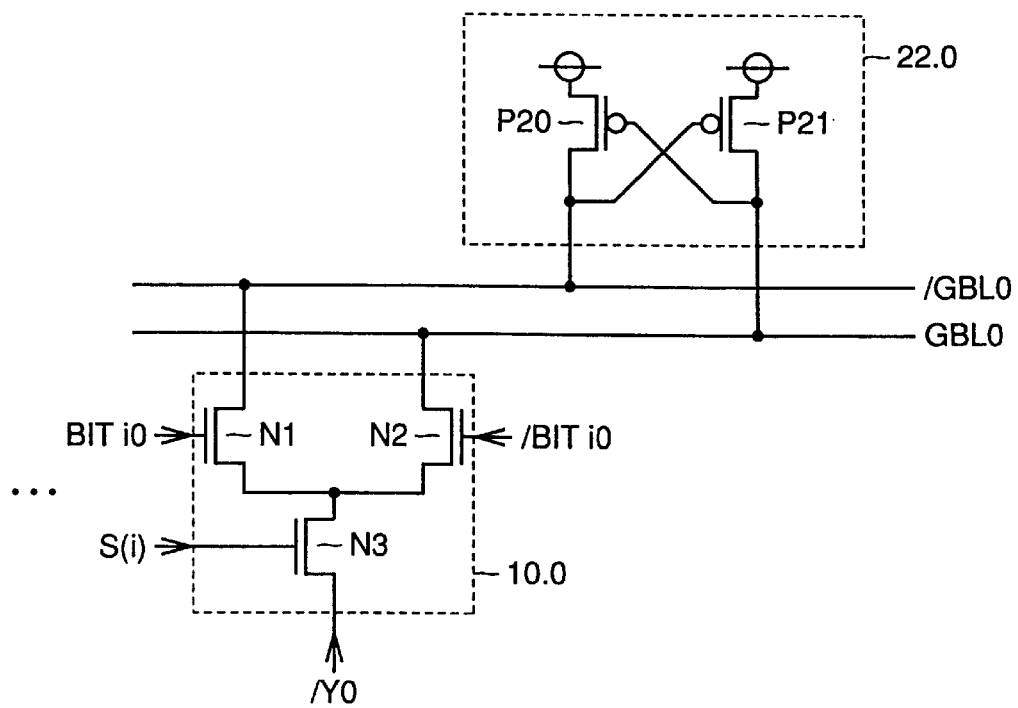
FIG. 17 shows an example of a specific structure of an load circuit corresponding to a column sense amplifier in an embodiment 3 of the invention.

FIG. 17 representatively shows a load circuit 22.0 corresponding to global bit line pair GBL0 and /GBL0. For reference, a relationship with input circuit 10.0 is also shown. The other load circuits (which will be generally referred to as load circuits 22, hereinafter) have the same structures as that shown in FIG. 17.

The embodiment 3 of the invention uses load circuit 22 shown in FIG. 17 instead of load circuit 20 in the embodiment 1 of the invention.

As shown in FIG. 17, load circuit 22.0 in the embodiment 3 of the invention includes PMOS transistors P20 and P21. PMOS transistor P20 is connected between the power supply potential and corresponding global bit line /GBL0. PMOS transistor P21 is connected between the power supply potential and corresponding global bit line GBL0. The gate electrode of PMOS transistor P20 is connected to global bit line /GBL0. The gate electrode of PMOS transistor P21 is connected to global bit line /GBL0.

As already described in connection with the embodiment 1 of the invention, load circuit 20 is formed of the four elements, i.e., transistors. However, load circuit 22 shown in FIG. 17 is formed of two elements, i.e., transistors. Therefore, the transistors in the load portion can be reduced in number, and therefore the whole layout area can be reduced.

[Embodiment 4]

An input circuit and a load circuit corresponding to a column sense amplifier in an embodiment 4 of the invention will be described below with reference to FIG. 18.

Figure 18:
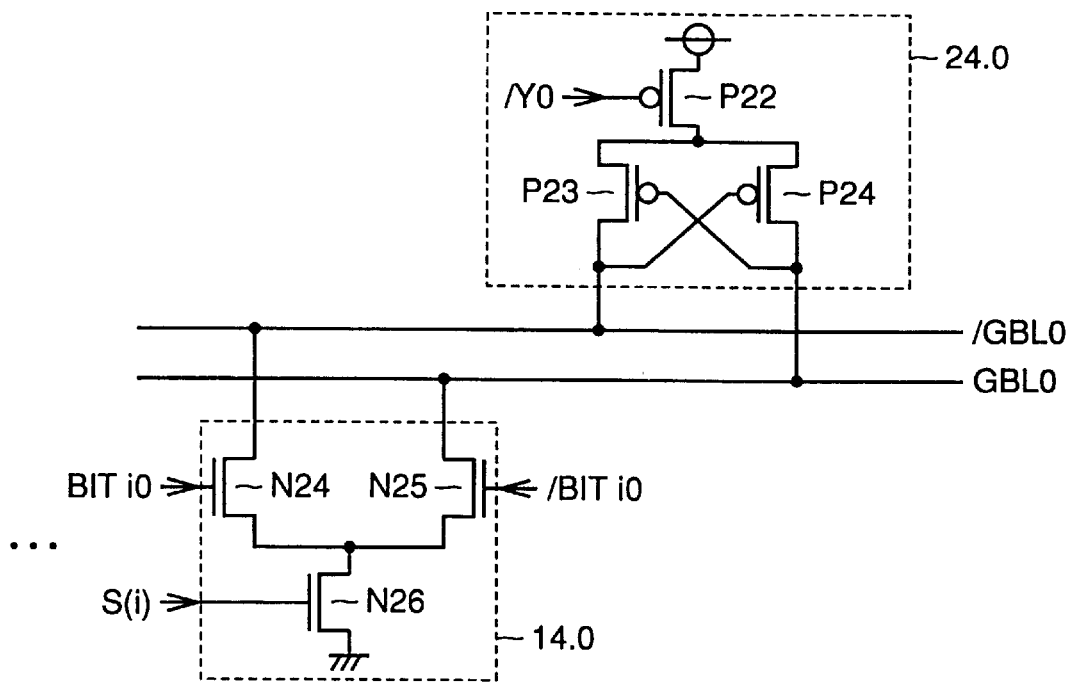
FIG. 18 shows by way of example specific structures of an input circuit and a load circuit corresponding to a column sense amplifier in an embodiment 4 of the invention.

FIG. 18 representatively shows an input circuit 14.0 in memory block BKi corresponding to global bit line pair GBL0 and /GBL0 and a load circuit 24.0. The other load circuits (which will be generally referred to as load circuits 24, hereinafter) have the same structures as that shown in FIG. 18. The other internal circuits (which will be generally referred to as internal circuits 14, hereinafter) have the same structures as that shown in FIG. 18.

In the embodiment 4 of the invention, load circuit 24 shown in FIG. 18 is used instead of load circuit 20 in the embodiment 1 of the invention, and input circuit 14 shown in FIG. 18 is used instead of input circuit 10.

Input circuit 14.0 shown in FIG. 18 includes NMOS transistors N24, N25 and N26. NMOS transistor N24 is connected between corresponding global bit line /GBL0 and one of the conductive terminals of NMOS transistor N26. NMOS transistor N25 is connected between corresponding global bit line GBL0 and one of the conductive terminals of NMOS transistor N26. The other conductive terminal of NMOS transistor N26 is connected to the ground potential.

NMOS transistor N26 receives block-corresponding sense amplifier activating signal S(i) on its gate electrode. The gate electrode of NMOS transistor N24 is connected to corresponding bit line BITi0, and the gate electrode of NMOS transistor N25 is connected to corresponding bit line /BITi0.

The load circuit 24.0 shown in FIG. 18 includes PMOS transistors P22, P23 and P24. PMOS transistor P23 is connected between one of the conductive terminals of PMOS transistor P22 and corresponding global bit line /GBL0. PMOS transistor P24 is connected between one of the conductive terminals of PMOS transistor P22 and corresponding global bit line GBL0. The other conductive terminal of PMOS transistor P22 is connected to the power supply potential.

The gate electrode of PMOS transistor P22 is connected to the Y-decode line transmitting corresponding Y-address signal /Y0. The gate electrode of PMOS transistor P23 is connected to corresponding global bit line GBL0, and the gate electrode of PMOS transistor P24 is connected to corresponding global bit line /GBL0.

The Y-decode line transmitting the Y-address signal is arranged on the side of load circuit 24. Thereby, it is not necessary to extend the Y-decode line to each memory block BK so that the interconnection layers can be reduced, and therefore reduction in yield can be suppressed.

[Embodiment 5]

An internal circuit and a load circuit corresponding to a column sense amplifier in an embodiment 5 of the invention will now be described below with reference to FIG. 19.

Figure 19:
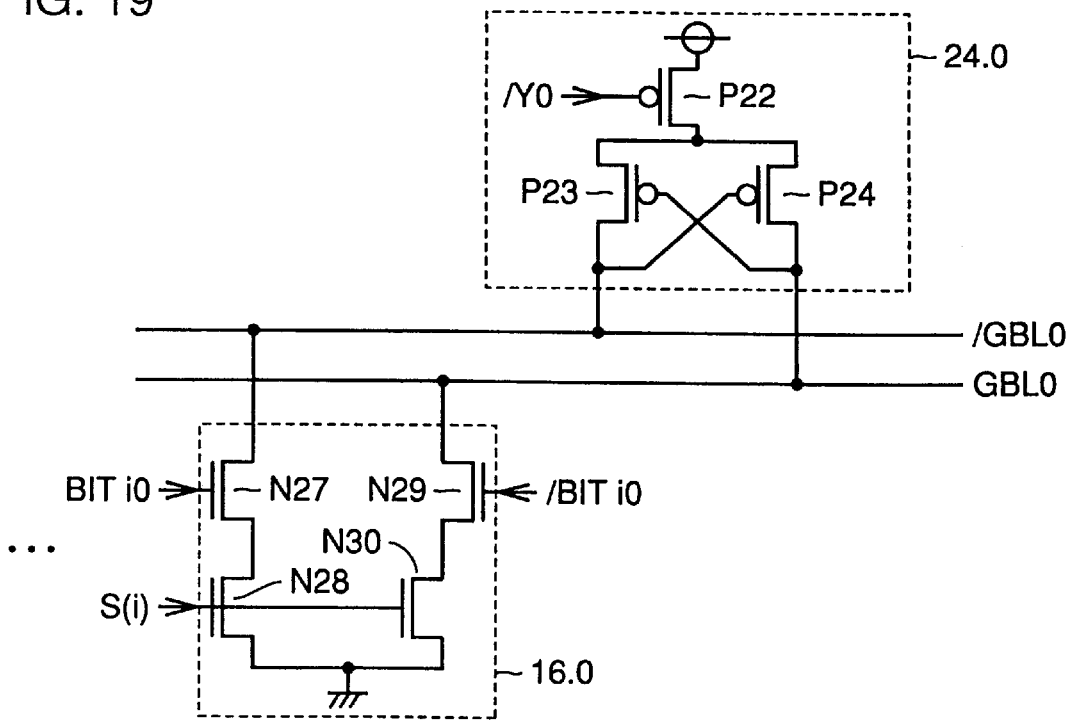
FIG. 19 shows an example of a specific structure of an input circuit corresponding to a column sense amplifier in an embodiment 5 of the invention.

FIG. 19 representatively shows input circuit 16.0 in memory block BKi corresponding to global bit line pair GBL0 and /GBL0. For reference, a relationship with load circuit 24.0 is also shown. The other input circuits (which will be generally referred to as input circuits 16, hereinafter) have the same structures as that shown in FIG. 19.

In the embodiment 5 of the invention, load circuit 24 shown in FIG. 19 is used instead of load circuit 20 in the embodiment 1 of the invention, and input circuit 16 shown in FIG. 19 is used instead of input circuit 10.

Input circuit 16.0 shown in FIG. 19 includes NMOS transistors N27, N28, N29 and N30. NMOS transistors N27 and N28 are connected in series between global bit line /GBL0 and the ground potential. NMOS transistors N29 and N30 are connected in series between corresponding global bit line GBL0 and the ground potential.

Each of NMOS transistors N28 and N30 receives block-corresponding sense amplifier activating signal S(i) on its gate electrode. The gate electrode of NMOS transistor N27 is connected to corresponding bit line BITi0, and the gate electrode of NMOS transistor N29 is connected to corresponding bit line /BITi0.

As described above, the transistors (NMOS transistors N28 and N30) which receive block-corresponding sense amplifier activating signal are arranged correspondingly to the bit lines, respectively, so that a short circuit between the global bit lines can be avoided.

Since the Y-address signal is received on the side of load circuit 24, the Y-decode line can be short. Thereby, the number of interconnections can be reduced, and reduction in yield can be prevented.

[Embodiment 6]

An input circuit and a load circuit corresponding to the column sense amplifier in an embodiment 6 of the invention will be described below with reference to FIG. 20.

Figure 20:
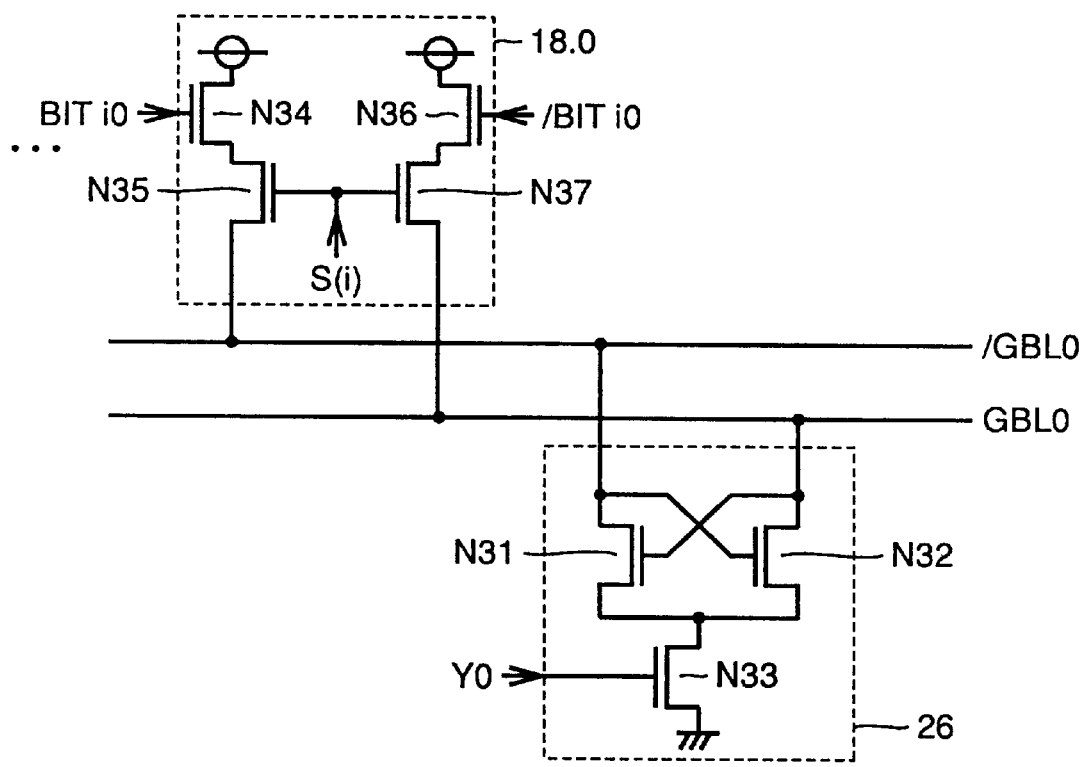
FIG. 20 shows by way of example specific structures of an input circuit and a load circuit corresponding to a column sense amplifier in an embodiment 6 of the invention.

FIG. 20 representatively shows input circuit 18.0 in memory block BKi corresponding to global bit line pair GBL0 and /GBL0 and load circuit 26.0.

The other input circuits (which will be generally referred to as input circuits 18, hereinafter) have the same structures as input circuit 18.0 shown in FIG. 20. The other load circuits (which will be generally referred to as load circuits 26, hereinafter) have the same structures as load circuit 26.0 shown in FIG. 20.

In the embodiment 6 of the invention, load circuit 26 shown in FIG. 20 is used instead of load circuit 20 in the embodiment 1 of the invention, and input circuit 18 shown in FIG. 20 is used instead of input circuit 10.

Input circuit 18.0 shown in FIG. 20 includes NMOS transistors N34, N35, N36 and N37. NMOS transistors N34 and N35 are connected in series between the power supply potential and corresponding global bit line /GBL0. NMOS transistors N36 and N37 are connected in series between the power supply potential and corresponding global bit line GBL0.

Each of NMOS transistors N35 and N37 receives block-corresponding sense amplifier activating signal S(i) on its gate electrode. The gate electrode of NMOS transistor N34 is connected to corresponding bit line BITi0, and the gate electrode of NMOS transistor N37 is connected to corresponding bit line /BITi0.

Load circuit 26.0 shown in FIG. 20 includes NMOS transistors N31, N32 and N33. NMOS transistor N33 receives corresponding Y-address signal Y0 on its gate electrode. NMOS transistors N31 and N32 form the load circuit of a cross-coupling type.

One of conductive terminals of NMOS transistor N32 and the gate electrode of NMOS transistor N31 are connected to corresponding global bit line GBL0. One of conductive terminals of NMOS transistor N31 and the gate electrode of NMOS transistor N32 are connected to corresponding global bit line /GBL0.

As described above, the transistors (NMOS transistors N35 and N37) receiving the block-corresponding activating signal are arranged correspondingly to the bit lines, respectively, so that a short circuit between the global bit lines can be avoided.

Further, the Y-address signal is received on the side of load circuit 26 so that the Y-decode line can be short. Thereby, the number of interconnections can be reduced, and reduction in yield can be prevented.

[Embodiment 7]

A semiconductor memory device of an embodiment 7 of the invention will be described below with reference to FIG. 21. The semiconductor memory device of the embodiment 7 of the invention has the same whole structure as semiconductor memory device 1000 shown in FIG. 1.

Figure 21:
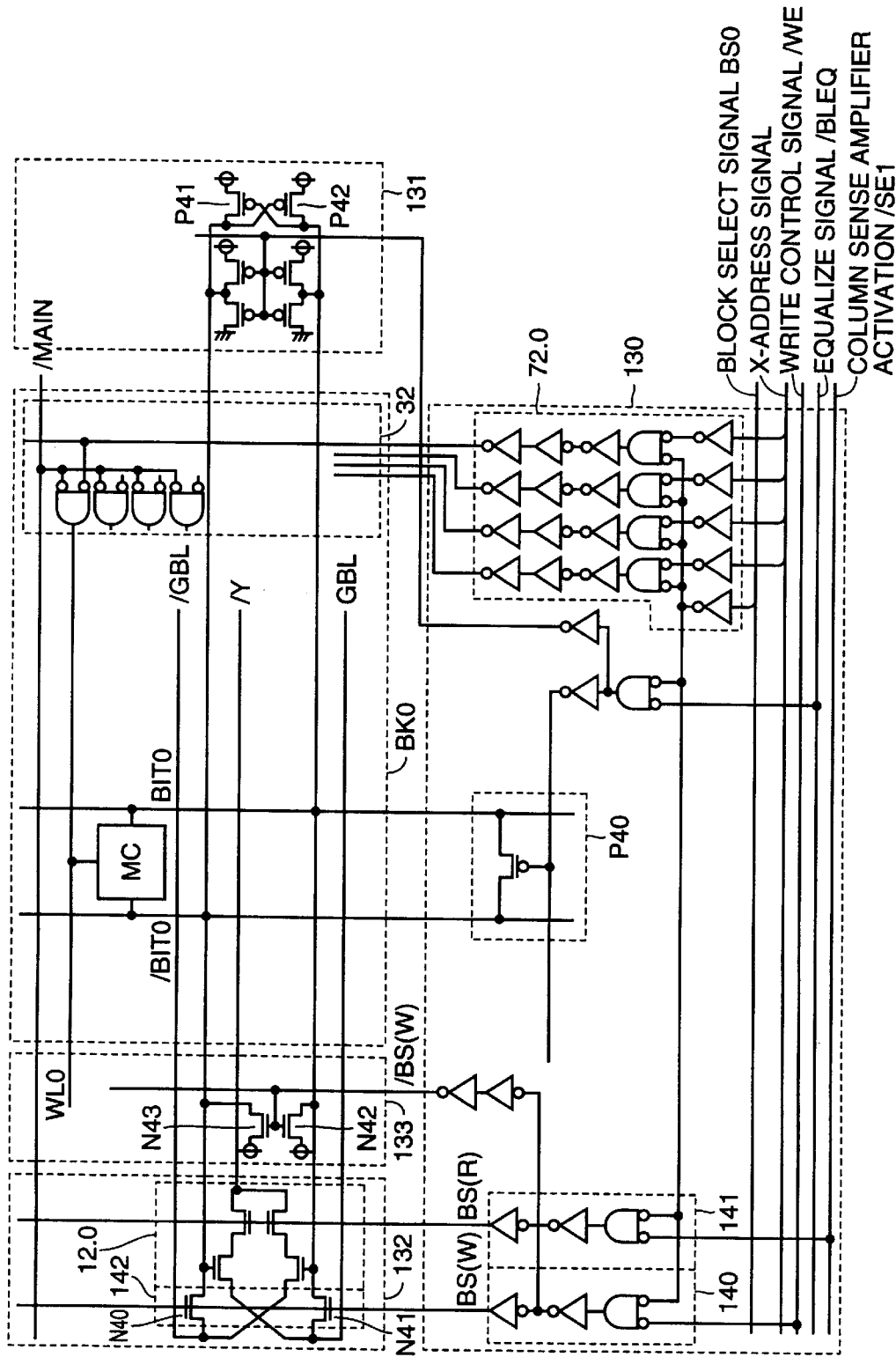
FIG. 21 shows a structure of a major portion of a semiconductor memory device of an embodiment 7 of the invention.

FIG. 21 representatively shows memory block BK0 and its peripheral circuit. Other memory blocks BK (not shown) and their peripheral circuits have the same structures as those shown in FIG. 21.

In FIG. 21, the semiconductor memory device of the embodiment 7 of the invention includes memory block BK0 formed of the plurality of memory cells MC, the plurality of bit line pairs BIT0 and /BIT0, . . . , the plurality of word lines WL0 and word driver 32.

Bit lines BIT0 and /BIT0 are related to global bit line pair GBL0 and /GBL0. As already described in connection with the embodiment 1, word driver 32 sets one of the plurality of word lines to the selected state in response to the corresponding main address signal /MAIN0, . . . and a signal sent from X-decoder 72.0, which will be described later.

In FIG. 21, the semiconductor memory device of the embodiment 7 of the invention further includes a block control circuit 130, a precharge circuit 131, a column sense amplifier input portion 132 and an NMOS load circuit 133.

Block control circuit 130 includes X-decoder 72.0 (see FIG. 14), PMOS transistors P40, a block select signal generating circuit 140 for writing, and a block select signal generating circuit 141 for reading.

X-decoder 72.0 issues the lower row address signal, as already described with reference to FIG. 14. PMOS transistor P40 is an element for equalizing bit line pair BIT0 and /BIT0, and sets bit line pair BIT0 and /BIT0 to the equal potential in response to corresponding block select signal BS0 and an equalize signal /BLEQ.

Write block select signal generating circuit 140 receives on its inputs the signal corresponding to block select signal BS0 and write control signal /WE designating the write operation, and issues a write block select signal BS(W) activating write transfer gate 142, which will be described later.

For reducing the operation current, sense amplifier activating signal /SE1 issued from an ATD circuit (not shown) and block select signal BS0 are logically determined, and thereby a read block select signal BS(R) is issued.

Read block select signal generating circuit 141 receives on its inputs the signal corresponding to block select signal BS0 and column sense amplifier activating signal /SE1, and issues read block select signal BS(R) activating the internal circuit which corresponds to the column sense amplifier, and will be described later.

Column sense amplifier input portion 132 includes write transfer gate 142 and input circuit 12.0 (see FIG. 16).

Write transfer gate 142 is formed of NMOS transistors N40 and N41. Each of NMOS transistors N40 and N41 receives write block select signal BS(W) on its gate electrode. NMOS transistors N40 and N41 transmit a signal from corresponding global bit line pair GBL0 and /GBL0 onto corresponding bit line pair BIT0 and /BIT0.

Input circuit 12.0 is activated in response to read block select signal BS(R), and changes the potentials on corresponding global bit line pair GBL0 and /GBL0 based on the potentials on corresponding bit line pair BIT0 and /BIT0.

NMOS load circuit 133 is formed of NMOS transistors N42 and N43. Each of NMOS transistors N42 and N43 receives on its gate an inverted write block select signal /BS(W). NMOS transistors N42 and N43 supply the power supply potential onto corresponding bit line pair BIT0 and /BIT0.

Precharge circuit 131 receives a signal corresponding to equalize signal /BLEQ, and precharges bit line pair BIT0 and /BIT0. For increasing an effect by the bit line load formed of the PMOS cross couple in the read operation, bit line pair BIT0 and /BIT0 is precharged to an intermediate potential in accordance with equalize signal /BLEQ.

Precharge circuit 131 inclues PMOS transistors P41 and P42 of the cross-couple type which form the bit line load. Since the bit line load is formed of the PMOS cross coupling, write transfer gate 142 is formed of the NMOS transistors. Thereby, one of bit lines BIT0 and /BIT automatically attains L-level when the other attains H-level.

NMOS load circuit 133, which is controlled in response to inverted write block select signal /BS(W), prevents such a situation during reading that corresponding bit line pair BIT0 and /BIT0 is excessively opened and thereby the potentials at L-level, which may cause erroneous writing, appear on bit line pair BIT0 and /BIT0.

In the write operation, NMOS load circuit 133 is turned off to lower reliably the potential on corresponding bit line BIT0 or /BIT0 to 0 V.

A structure of the transfer gate peripheral circuit for one I/O corresponding to FIG. 21 will be described below with reference to FIG. 22.

Figure 22:
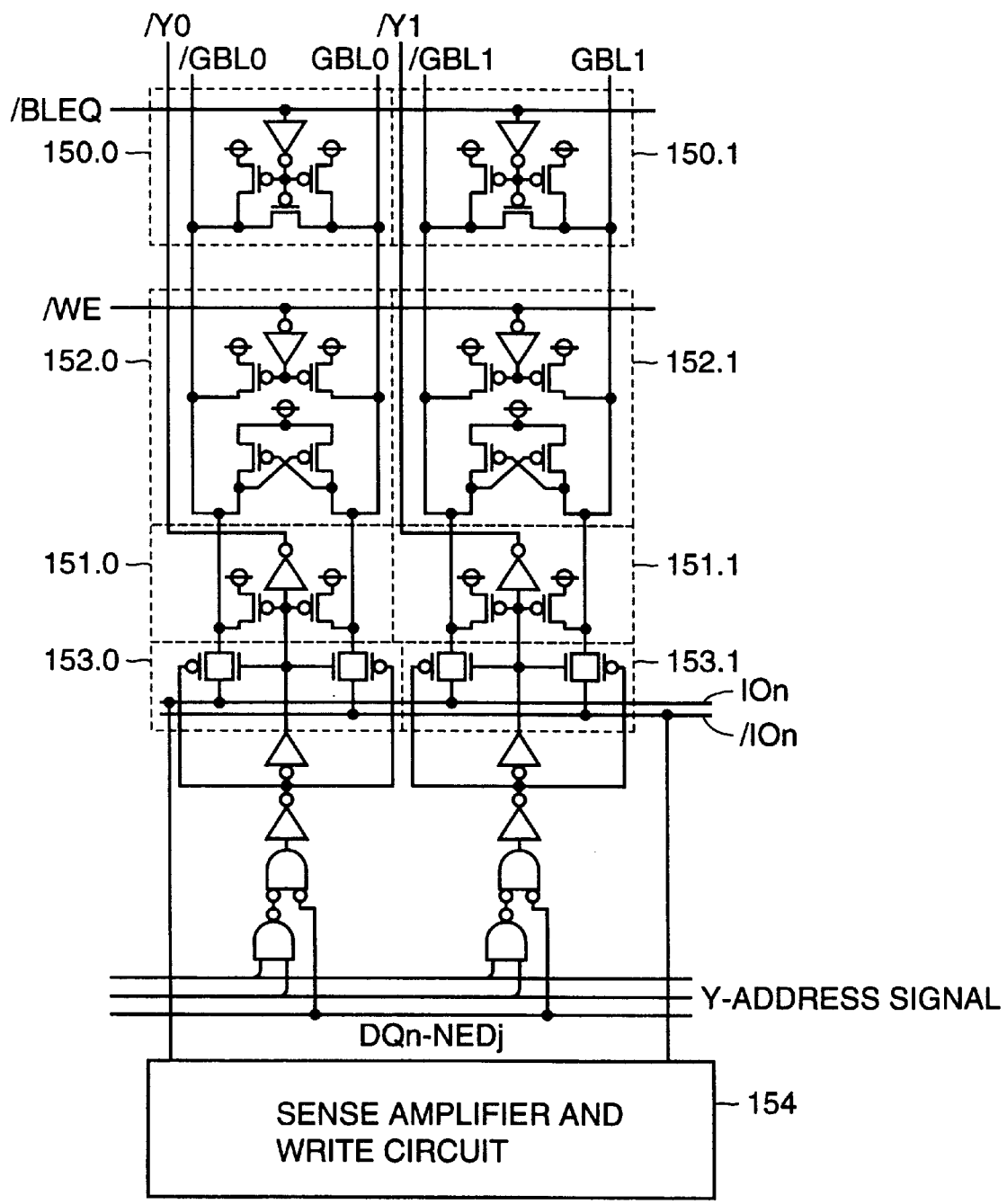
FIG. 22 shows a transfer gate peripheral circuit in one I/O structure of the embodiment 7 of the invention.

The circuit in FIG. 22 corresponds to one of a plurality of data I/O pins.

Referring to FIG. 22, global bit line pair GBL0 and /GBL0 is related to the Y-decode line (represented by "/Y0") transmitting Y-address signal /Y0, and global bit line pair GBL1 and /GBL1 is related to the Y-decode line (represented by "/Y1") transmitting Y-address signal /Y1.

Global bit line pair GBL0 and /GBL0 is connected to an equalize circuit 150, and global bit line pair GBL1 and /GBL1 is connected to an equalize circuit 150.1. Equalize circuits 150.0 and 150.1 are activated in response to equalize signal /BLEQ.

Global bit line pair GBL0 and /GBL0 is connected to load circuit 152.0 corresponding to the column sense amplifier, and global bit line pair GBL1 and /GBL1 is connected to load circuit 152.1 corresponding to the column sense amplifier. Load circuits 152.0 and 152.1 have the structures already described with reference to FIG. 16. Load circuits 152.0 and 152.1 are activated in response to write control signal /WE in contrast to load circuit 20.

Global bit line pair GBL0 and /GBL0 is connected to a clamp circuit 151.0, and global bit line pair GBL1 and /GBL1 is connected to a clamp circuit 151.2.

Clamp circuit 151.0 fixes corresponding global bit line pair GBL0 and /GBL0, which is not selected, at H-level in response to the potential on corresponding Y-decode line /Y0.

Clamp circuit 151.1 fixes corresponding global bit line pair GBL1 and /GBL1, which is not selected, at H-level in response to the potential on corresponding Y-decode line /Y1.

Global bit line pair GBL0 and /GBL0 is connected to data I/O line pair IOn and /IOn through a transfer gate 153.0. Global bit line pair GBL1 and /GBL1 is connected to data I/O line pair IOn and /IOn through a transfer gate 153.1. Data I/O line pair IOn and /IOn is further connected to a sense amplifier and write circuit 154.

Owing to the structure wherein the load circuit of the column sense amplifier is commonly used by the memory blocks, a fast operation can be achieved, and a chip area can be reduced.

In the input circuit of the column sense amplifier, the control transistor is provided for each bit line so that a short circuit between the global bit lines can be prevented, and a current leakage can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory blocks each including a plurality of memory cells arranged correspondingly to a plurality of rows and a plurality of columns, respectively, a plurality of word lines arranged correspondingly to said plurality of rows, and a plurality of bit line pairs arranged correspondingly to said plurality of columns;

a plurality of global bit line pairs each arranged commonly to said bit line pairs in the corresponding columns of said plurality of memory blocks;

a plurality of amplifier means arranged correspondingly to said plurality of global bit line pairs for amplifying potential differences of the corresponding global bit line pairs, respectively;

a data I/O terminal; and a data I/O line for transmitting a data signal between said plurality of global bit line pairs and said data I/O terminal, each of said plurality of amplifier means including load means for supplying current to the corresponding global bit line pair in accordance with a potential on the corresponding global bit line pair, and a plurality of input means arranged correspondingly to the corresponding bit line pairs in each of said plurality of memory blocks, each of said plurality of input means receiving the current from the corresponding global bit line pair in accordance with a potential on the corresponding bit line pair.

2. The semiconductor memory device according to claim 1, wherein each of said global bit line pairs includes:

a first global bit line, and a second global bit line;

each of said bit line pairs includes:

a first bit line, and a second bit line; and said semiconductor memory device further comprises:

block select means for issuing a block select signal for selecting said memory block in response to an external signal, column select means for generating a column select signal for selecting the corresponding column in each of said plurality of memory blocks in response to the external signal, and a plurality of column decode lines transmitting the corresponding column select signals, respectively;

each of said plurality of input means includes:

switch means to be turned on and off in response to the corresponding block select signal issued from said block select means and the potential on the corresponding column decode line, first input means being responsive to the on state of said switch means to receive the current from the corresponding first global bit line in accordance with the potential on the corresponding first bit line, and second input means being responsive to the on state of said switch means to receive the current from the corresponding second global bit line in accordance with the potential on the corresponding second bit line; and said load means includes:

first supply means being responsive to the potential on the corresponding global bit line pair to supply the current to the corresponding first global bit line, and second supply means being responsive to the potential on the corresponding global bit line pair to supply the current to the corresponding second global bit line.

3. The semiconductor memory device according to claim 1, wherein each of said global bit line pairs includes:

a first global bit line, and a second global bit line;

each of said bit line pairs includes:

a first bit line, and a second bit line; and said semiconductor memory device further comprises:

block select means for issuing a block select signal for selecting said memory block in response to an external signal, column select means for generating a column select signal for selecting the corresponding column in each of said plurality of memory blocks in response to the external signal, and a plurality of column decode lines transmitting the corresponding column select signals, respectively;

each of said plurality of input means includes:

first switch means to be turned on and off in response to the corresponding block select signal issued from said block select means and the potential on the corresponding column decode line, second switch means to be turned on and off in response to the corresponding block select signal issued from said block select means and the potential on the corresponding column decode line, first input means being responsive to the on state of said first switch means to receive the current from the corresponding first global bit line in accordance with the potential on the corresponding first bit line, and second input means being responsive to the on state of said second switch means to receive the current from the corresponding second global bit line in accordance with the potential on the corresponding second bit line; and said load means includes:

first supply means being responsive to the potential on the corresponding global bit line pair to supply the current to the corresponding first global bit line, and second supply means being responsive to the potential on the corresponding global bit line pair to supply the current to the corresponding second global bit line.

4. The semiconductor memory device according to claim 1, wherein each of said global bit line pairs includes:

a first global bit line, and a second global bit line;

each of said bit line pairs includes:

a first bit line, and a second bit line; and said semiconductor memory device further comprises:

block select means for issuing a block select signal for selecting said memory block in response to an external signal, column select means for generating a column select signal for selecting the corresponding column in each of said plurality of memory blocks in response to the external signal, and a plurality of column decode lines transmitting the corresponding column select signals, respectively;

each of said plurality of input means includes:

switch means to be turned on and off in response to the corresponding block select signal issued from said block select means, first input means being responsive to the on state of said switch means to receive the current from the corresponding first global bit line in accordance with the potential on the corresponding first bit line, and second input means being responsive to the on state of said switch means to receive the current from the corresponding second global bit line in accordance with the potential on the corresponding second bit line; and said load means includes:

a first node, control means being responsive to the potential on the corresponding column decode line to be turned on and connect said first node to the corresponding power supply, first supply means being responsive to the potential on the corresponding global bit line pair to supply the current from said first node to the corresponding first global bit line, and second supply means being responsive to the potential on the corresponding global bit line pair to supply the current from said first node to the corresponding second global bit line.

5. The semiconductor memory device according to claim 1, wherein each of said global bit line pairs includes:

a first global bit line, and a second global bit line;

each of said bit line pairs includes:

a first bit line, and a second bit line; and said semiconductor memory device further comprises:

block select means for issuing a block select signal for selecting said memory block in response to an external signal, column select means for generating a column select signal for selecting the corresponding column in each of said plurality of memory blocks in response to the external signal, and a plurality of column decode lines transmitting the corresponding column select signals, respectively;

each of said plurality of input means includes:

first switch means to be turned on and off in response to the corresponding block select signal issued from said block select means, second switch means to be turned on and off in response to the corresponding block select signal issued from said block select means, first input means being responsive to the on state of said first switch means to receive the current from the corresponding first global bit line in accordance with the potential on the corresponding first bit line, and second input means being responsive to the on state of said second switch means to receive the current from the corresponding second global bit line in accordance with the potential on the corresponding second bit line; and said load means includes:

a first node, control means being responsive to the potential on the corresponding column decode line to be turned on and connect said first node to the corresponding power supply, first supply means being responsive to the potential on the corresponding global bit line pair to supply the current from said first node to the corresponding first global bit line, and second supply means being responsive to the potential on the corresponding global bit line pair to supply the current from said first node to the corresponding second global bit line.

6. The semiconductor memory device according to claim 2, wherein each of said memory cells includes a transistor of a first conductivity type, each of said switch means, said first input means and said second input means includes a transistor of said first conductivity type, and each of said first and second supply means includes a transistor of a second conductivity type.

7. The semiconductor memory device according to claim 3, wherein each of said memory cells includes transistor of a first conductivity type, each of said first switch means, said second switch means, said first input means and said second input means includes a transistor of said first conductivity type, and each of said first and second supply means includes a transistor of a second conductivity type.

8. The semiconductor memory device according to claim 4, wherein each of said memory cells includes a transistor of a first conductivity type, each of said switch means, said first input means and said second input means includes a transistor of said first conductivity type, and each of said first and second supply means includes a transistor of a second conductivity type.

9. The semiconductor memory device according to claim 5, wherein each of said memory cells includes a transistor of a first conductivity type, each of said first switch means, said second switch means, said first input means and said second input means includes a transistor of said first conductivity type, and each of said control means, said first supply means and said second supply means includes a transistor of a second conductivity type.

10. The semiconductor memory device according to claim 2, wherein each of said plurality of bit line pairs is formed of a metal interconnection of a first layer, each of said plurality of column decode lines and said plurality of global bit line pairs is formed of a metal interconnection of a second layer formed above said metal interconnection of said first layer and crossing each of said metal interconnections of said first layer, and said plurality of column decode lines and said plurality of global bit line pairs are all set to the same potential during standby.

11. The semiconductor memory device according to claim 3, wherein each of said plurality of bit line pairs is formed of a metal interconnection of a first layer, each of said plurality of column decode lines and said plurality of global bit line pairs is formed of a metal interconnection of a second layer formed above said metal interconnection of said first layer and crossing each of said metal interconnections of said first layer, and said plurality of column decode lines and said plurality of global bit line pairs are all set to the same potential during standby.

12. The semiconductor memory device according to claim 4, wherein each of said plurality of bit line pairs is formed of a metal interconnection of a first layer, each of said plurality of column decode lines and said plurality of global bit line pairs is formed of a metal interconnection of a second layer formed above said metal interconnection of said first layer and crossing each of said metal interconnections of said first layer, and said plurality of column decode lines and said plurality of global bit line pairs are all set to the same potential during standby.

13. The semiconductor memory device according to claim 5, wherein each of said plurality of bit line pairs is formed of a metal interconnection of a first layer, each of said plurality of column decode lines and said plurality of global bit line pairs is formed of a metal interconnection of a second layer formed above said metal interconnection of said first layer and crossing each of said metal interconnections of said first layer, and said plurality of column decode lines and said plurality of global bit line pairs are all set to the same potential during standby.

14. The semiconductor memory device according to claim 2, further comprising a plurality of gate means each arranged between the corresponding load means and said data I/O line for coupling said data I/O line and the corresponding global bit line pair together in response to the corresponding column select signal.

15. The semiconductor memory device according to claim 3, further comprising a plurality of gate means each arranged between the corresponding load means and said data I/O line for coupling said data I/O line and the corresponding global bit line pair together in response to the corresponding column select signal.

16. The semiconductor memory device according to claim 4, further comprising a plurality of gate means each arranged between the corresponding load means and said data I/O line for coupling said data I/O line and the corresponding global bit line pair together in response to the corresponding column select signal.

17. The semiconductor memory device according to claim 5, further comprising a plurality of gate means each arranged between the corresponding load means and said data I/O line for coupling said data I/O line and the corresponding global bit line pair together in response to the corresponding column select signal.

* * * * *